(12) United States Patent
Murayama

(10) Patent No.: US 6,535,270 B1
(45) Date of Patent: Mar. 18, 2003

(54) EXPOSURE APPARATUS AND AIR-CONDITIONING APPARATUS FOR USE WITH EXPOSURE APPARATUS

(75) Inventor: Masayuki Murayama, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/266,873

(22) Filed: Mar. 12, 1999

Related U.S. Application Data

(63) Continuation of application No. 08/824,908, filed on Mar. 26, 1997, now abandoned.

(30) Foreign Application Priority Data

| Mar. 27, 1996 | (JP) | ................................................ | 8-72894 |
| Mar. 28, 1996 | (JP) | ................................................ | 8-73776 |
| Apr. 3, 1996 | (JP) | ................................................ | 8-81300 |
| Apr. 9, 1996 | (JP) | ................................................ | 8-86711 |

(51) Int. Cl.$^7$ .......................... G03B 27/52; G03B 27/42
(52) U.S. Cl. .......................................... 355/30; 355/53
(58) Field of Search .......................... 355/30, 18, 52, 355/53, 67, 77

(56) References Cited

U.S. PATENT DOCUMENTS

| 4,870,589 A | * | 9/1989 | Takahata et al. ........ 354/464.04 |
| 5,325,705 A | * | 7/1994 | Tom .......................... 73/31.03 |
| 5,430,303 A | * | 7/1995 | Matsumoto et al. ...... 250/490.2 |
| 5,434,644 A | * | 7/1995 | Kitano et al. .................. 355/30 |
| 5,633,698 A | * | 5/1997 | Imai .............................. 355/72 |
| 5,685,895 A | * | 11/1997 | Hagiwara et al. .............. 96/117 |
| 5,856,198 A | * | 1/1999 | Joffe et al. ................... 436/100 |
| 5,871,587 A | * | 2/1999 | Hasegawa et al. ........... 118/719 |
| 5,906,429 A | * | 5/1999 | Mori et al. ................... 362/293 |

\* cited by examiner

Primary Examiner—Hung Henry Nguyen
(74) Attorney, Agent, or Firm—Armstrong, Westerman & Hattori, LLP.

(57) ABSTRACT

Air-conditioning is effected in a chamber of an exposure apparatus for transferring a pattern formed on a mask onto a photosensitized substrate by exposure. The chamber houses at least a part of the exposure apparatus. An impurity-removing filter is provided for removing gaseous impurities from a stream of ambient air being introduced into the chamber and/or from a gas stream recirculating in the chamber. A pair of impurity-concentration-measuring devices are disposed upstream and downstream, respectively, of the filter. End-of-life of the filter is determined based on measurements from the impurity-concentration-measuring devices. Introducing the ambient air into the chamber is stopped when the impurity-concentration-measuring device disposed upstream of the filter has indicated a gaseous impurity concentration above a predetermined level. The integrity of the airtightness of the chamber around a negative pressure area in the chamber is sensed. When a failure in airtightness is detected, the failure is indicated and/or the recirculation of a gas stream in the chamber is stopped to prevent the ambient air containing impurities from leaking into the chamber under the influence of the negative pressure. In the exposure apparatus, among others the photosensitized substrate and the illumination optical system are quite sensitive to impurities, so that dehumidified gas is supplied to the areas around them. An air-conditioning apparatus for effecting air-conditioning to the chamber is separated from the chamber, and an impurity-removing filter element is disposed in a gas supply duct in the air-conditioning apparatus.

27 Claims, 20 Drawing Sheets

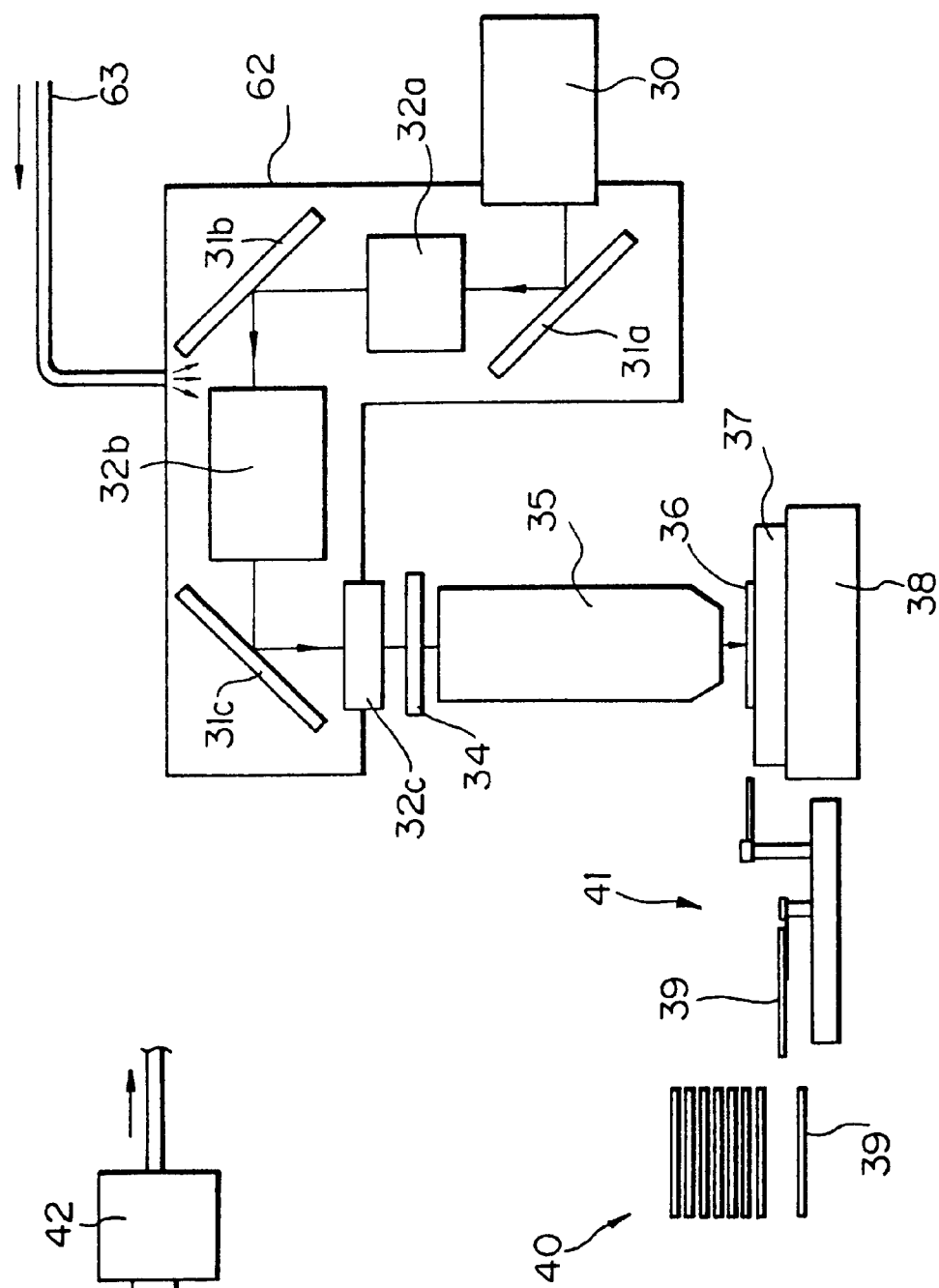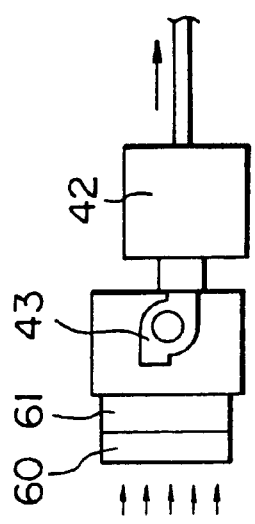

EXPOSURE APPARATUS AND AIR-CONDITIONING APPARATUS FOR USE WITH EXPOSURE APPARATUS

This application is a continuation of prior application Ser. No. 08/824,908 filed Mar. 26, 1997 now abandoned.

BACKGROUND OF THE INVENTION

The present invention relates to an exposure apparatus used for generating fine patterns for various products including semiconductor circuits (Ics), liquid crystal displays (LCDs) and the like, as well as to air-conditioning apparatus for use with such exposure apparatus. More particularly, the present invention relates to apparatus for effecting air-conditioning of a chamber which houses all or some of the components of an exposure apparatus for transferring a pattern formed on a mask onto a photosensitized substrate by exposure, including a light source, an illumination optical system, an exposure unit and others, in order to eliminate or minimize any harmful effects of impurities in the chamber.

A clean room used in fabrication of semiconductor devices is provided with an air purification system for removing particulate contaminants from the air in the room, and such air purification system typically uses high efficiency particulate air (HEPA) filters and/or ultra low penetration air (ULPA) filters. Various equipment and apparatus are used in the fabrication of semiconductor devices, among which exposure apparatus using ultraviolet (UV) light or deep-ultraviolet (DUV) light for exposure have been commonly used. In an exposure apparatus of this type, gaseous impurities in the surrounding atmosphere may undergo certain chemical and/or physical changes and form adhesive substances that tend to adhere to the surface of glass optical elements such as lenses and mirrors, resulting in blurring and/or reduced transmittance of the elements. For example, ammonium ions ($NH_4$) and sulfur oxides (SOx), two typical, harmful gaseous impurities, form an adhesive layer of ammonium sulfate (($NH_4$)$_2SO_4$) on a surface of a glass optical element.

Thus, for long-term, continuous and effective operation of an exposure apparatus using a UV or DUV light source, it is required that the space along the light path of the light beam from the light source be filled with a gas having no sensitivity to UV or DUV radiation such as nitrogen and helium, or with an environmental gas (ambient air) having any harmful gaseous impurities removed therefrom. A known technique used for this purpose is to confine the space along the light path of the exposure light beam to an airtight chamber, and fill the chamber with a gas having no sensitivity to exposure radiation. The gas is supplied from a suitable gas supply device such as a gas cylinder or a gas storage tank. Another known technique used for this purpose is to supply ambient air outside the exposure apparatus to the illumination optical system in the exposure apparatus, after the air has been passed through an impurity-removing filter such as a chemical filter to remove any harmful gaseous impurities from the air.

Chemical filters can remove, unlike HEPA and ULPA filters, gaseous impurities from the environmental gas. Various chemical filters are commonly used, including those using fibrous or granulate activated carbon, those utilizing ion exchange reaction provided by various ion exchange resins, and those using fibrous activated carbon with some sort of agent added. Examples of chemical filters utilizing an ion exchange reaction are products bearing a trademark "EPIX" available from Ebara Corporation in Japan. Examples of chemical filters using fibrous activated carbon with some sort of agent added are products bearing a trademark "CLEAN SORB" available from Kondo Kogyo Co, Ltd. in Japan.

Various resists are used in photolithographic process in order to form patterns on a substrate, among which chemically sensitized resists have become common recently. In general, chemically sensitized resists consist of a resin, a photosensitive acid generator (PAG), and either a dissolution promotor (for positive resists) or a cross-linking agent (for negative resists). When exposed to exposure radiation, the photosensitive acid generator generates an acid. During the post-exposure baking process, the acid acts as a catalyst. In the case of a positive resist, the catalyst increases the activity of the dissolution promotor to break cross-links between the polymer molecules. In the case of a negative resist, the catalyst increases the activity of the cross-linking agent to form cross-links between the polymer molecules. In both cases, a pattern is formed with the aid of the catalyst during the following development process, in which a positive resist using a dissolution promotor forms positive patterns while a negative resist using a cross-linking agent forms negative patterns on the substrate. Examples of the positive chemically amplified resists are products bearing a trademark "FH-EX1" available from Fuji-Hunt Corporation. Examples of negative chemically amplified resists are products bearing a trademark "XP" available from Shipray Corporation.

When a chemically sensitized resist is used, some basic gaseous impurities (ammonia and amines, for example) in the local atmosphere around the substrate and acid generated from the photosensitive acid generator may cause a neutralization reaction during the time interval between exposure to post-exposure baking, resulting in reduced sensitivity. Further, in the case of a positive resist this also results in the formation of a dissolution-resistant surface layer, which may affect the pattern transfer process. A commonly used technique used to avoid the adverse effects of such gaseous impurities is to fill the process atmosphere for the sequence of processes from the application process of chemically sensitized resist on a substrate (or from the exposure process of a substrate applied with chemically amplified resist) to post-exposure baking with a clean gas containing no impurities.

More specifically, where this technique is used to avoid adverse effects of gaseous impurities, a chamber is used to house the entire exposure apparatus or at least a critical part thereof. The chamber has an air inlet through which ambient air is introduced into the chamber. The air inlet is provided with a gaseous-impurity-removing device, such as a chemical filter, for preventing any gaseous impurities from entering the chamber. In addition, the chamber is provided with a second chemical filter for removing any gaseous impurities from a gas stream recirculating in the chamber.

However, the above prior art technique suffers from several problems as described below. First, a problem arises relating to the filters used. Chemical filters are commonly used as gaseous-impurity-removing devices. The impurity removal efficiency of a chemical filter, however, tends to gradually decrease as more gaseous impurities are caught and removed by the filter. The rate of decrease in the impurity removal efficiency depends on several factors including the concentrations of the gaseous impurities contained in the environmental gas in which the chemical filter is used, as well as the humidity of the environmental gas. An even rate of operation of the semiconductor device factory equipped with an exposure apparatus may cause significant changes in the concentrations of the gaseous impurities in the environmental air of the exposure apparatus.

An impurity-removing filter element has to be replaced when its impurity removal efficiency has dropped below a minimum acceptable level. Typically, the life of a filter element is defined as the point of time when its impurity removal efficiency has decreased to a predetermined threshold level. However, the rate of degradation of a filter element depends on environmental conditions as described above, and impurity concentrations in different environments of respective filter elements are quite different from each other, so that it is difficult to predict with precision when a particular filter element has reached the end of its effective life.

In order to determine the impurity removal efficiency of a filter element used with an exposure apparatus, it is required to set a gas-concentration-measuring device on the exposure apparatus for measurement at regular intervals. However, this may result in an increase in the nonworking time of the exposure apparatus because of the necessary time for setting and removal of the gas-concentration-measuring device on and away from the exposure apparatus as well as of the time for the concentration measurement itself. Further, where a plurality of exposure apparatus are disposed in a single clean room, the impurity concentration in the environment of one exposure apparatus may be quite different from that of another exposure apparatus, resulting in different rates of degradation of the filter elements used with them. Therefore, for the plurality of exposure apparatus, the impurity concentrations have to be measured individually, which results in a troublesome measurement work and may often result in a reduced productivity.

In addition, for an exposure apparatus using a chemical filter for introducing ambient air into the apparatus through the filter, if an abrupt and significant increase occurs in the gaseous impurity concentration in the ambient air outside the apparatus, then the chemical filter may not completely remove gaseous impurities from the air stream being introduced in the apparatus, resulting in possible contamination inside the apparatus and/or the formation of a dissolution-resistant layer on the surface of the chemically sensitized resist layer on the substrate being processed in the apparatus.

The above prior art technique also suffers from another problem relating to the integrity of the airtightness of the chamber which houses the entire exposure apparatus or a part thereof. The chamber is provided with an gas-delivering fan for producing a gas stream recirculating in the chamber, with the result that a negative pressure area is generated in the chamber upstream of the gas-delivering fan. Further, the chamber has an air inlet through which the ambient air is introduced into the chamber by means of suction produced by the negative pressure area near the air inlet. The chamber has a wall composed of panels, which joined to each other in such a way as to ensure airtightness of the chamber. In particular, such a portion of the chamber wall that is around the negative pressure area must be kept airtight, and the panels constituting that wall portion are typically joined with each other with appropriate sealant (silicone sealant, for example) applied to the joints between the panels. The airtightness is required because all the air introduced into the chamber must pass through the air inlet, i.e., no air must not be allowed to leak into the chamber through any other path such as a defect in a joint between two panels.

However, the airtightness of the chamber may be lost due to degradation or a failure of the sealant applied to the joints between the panels, such as chipping and cracking of the sealant. If the sealant suffers from such chips and/or cracks that are very small or hidden behind some other components of the exposure apparatus, the operator of the apparatus can not locate such defects in the sealant. This may allow leakage of ambient air containing impurities into the chamber, resulting in accelerated degradation of the gaseous-impurity-removing filter used in the chamber and/or contamination inside the chamber.

It is also known that a problem arises due to moisture contained in the gas in the chamber, as follows. Most of the amount of impurities contained in the ambient air is adsorbed on the surface of dust and water particulates floating in the ambient air. The ambient air in a building of a typical semiconductor device factory as well as the gas in the local atmosphere in the chamber of an exposure apparatus equipped in such factory has relatively large particles already removed therefrom by some sort of particulate filters such as ULPA filters. On the other hand, the humidity of such ambient air or gas is maintained at a level typically in the range of 30 to 50%. Any humidity level in this range allows the existence of water particulates floating in the air or gas, to which ions and other impurities are adsorbed, resulting in possible contamination inside the exposure apparatus.

Hexamethyldisilazane (HMDS), which is commonly used in semiconductor processes, tends to react with moisture in air or gas to undergo hydrolysis into trimethylsilanol and ammonia, as follows.

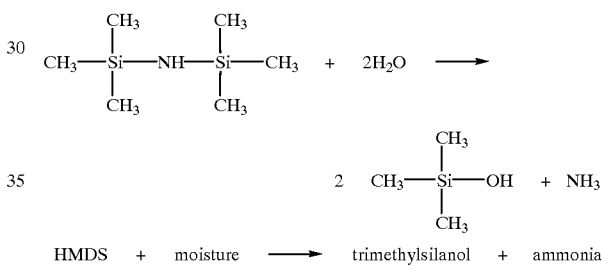

The resultant ammonia may react with the acid generated by PAG in the resist, which reaction affects the image formation properties of the resist. It is also known that some sort of amines, such as NMP, can affect the image formation properties of resists. In addition, it is very likely that various other matters which may react with moisture in air or gas to form harmful impurities are used in semiconductor processes.

Further, even moisture in ambient air itself may affect the image formation properties of resists. However, no special consideration has been given to humidity so far.

It is also noted in this relation that the complete removal or elimination of the moisture from the air in a semiconductor device factory or from the gas in the exposure apparatus equipped in the factory tends to cause a static discharge problem which may affect the exposure apparatus.

Often, either helium gas or nitrogen gas generated by vaporization of liquid nitrogen is used as a dry gas to be filled in the exposure apparatus. In such a case, because the exposure apparatus has to be continuously supplied with the dry gas in order to keep the inside of the apparatus filled with the gas, considerable consumption of the supplied gas arises, resulting in a large expenditure and even in a possible decrease in oxygen concentration in the environmental air in the factory, which may put workers at risk in the factory.

A further known problem arises in relation to the chemical filter elements which have to be housed in respective boxes and disposed at various places, such as inside the exposure apparatus, around the apparatus and/or in the flow path of the supplied gas. This problem is described with reference to FIG. 26 of the accompanying drawings.

FIG. 26 is a schematic representation showing a typical prior art exposure apparatus. The exposure apparatus has an exposure unit comprising a light source 200, a first mirror 201a, an illumination optical system 202, a second mirror 201b, a projection lens 203 and an XY-stage 204. The exposure unit serves to transfer a pattern formed on the reticle 205 onto a photosensitized substrate 207 placed on the XY-stage 204. The exposure unit is housed in a chamber 208.

The air in the chamber 208 is temperature-controlled by an air-conditioning apparatus 220, and delivered through an impurity-removing unit including a chemical filter 209 and a particulate filter 210 such as a HEPA filter. The filters 209 and 210 have respective filter boxes in which filter elements are housed. The filters 209 and 210 are disposed one after the other along the flow path of the air stream passing therethrough. The air stream flows out of the impurity-removing unit into the local atmosphere around the exposure unit, and then passes through a return path 211 and again is temperature-controlled by the air-conditioning apparatus 220 so as to recirculate in the chamber 208. The air-conditioning apparatus 220 includes components such as a temperature regulator 221 and a gas-delivering fan 222, which are connected through ducts 223a and 223b with the chamber 208. The return path 211 is upstream of the air-conditioning apparatus 220 and defines therein a negative pressure area with respect to the ambient air pressure outside the chamber 208. During the operation of the exposure apparatus, certain amounts of air repetitively leak out of the chamber from the local atmosphere around the exposure unit, and the corresponding amounts of air are repetitivey drawn into the chamber 208 through an air inlet 212 and an impurity-removing filter element 213 under the infuluence of the negative pressure in the above mentioned area.

As shown, an gaseous-impurity-removing filter, such as a chemical filter, comprises a filter element and a filter box for housing the filter element. The filter box is bulky and requires a relatively large installation space. In the case where an filter boxe is disposed in the exposure apparatus, the space in the apparatus available for other purposes is reduced and/or the exposure apparatus must have the larger volume for the filter box.

SUMMARY OF THE INVENTION

In view of the foregoing, it is a first object of the present invention to provide an exposure apparatus, in which end-of-life of a chemical filter element used in the exposure apparatus may be determined with precision, maintenance services such as replacement and/or cleaning of the chemical filter element may be performed in good time, and impurities in ambient air may be effectively prevented from entering the apparatus even when the impurity concentration in ambient air in the environment of the apparatus has made an abrupt and significant increase during the operation of the apparatus.

It is a second object of the present invention to provide an exposure apparatus with a chamber, in which any failure of the integrity of the airtightness of the chamber (which may be caused by some defect or another) will never lead to a leakage of the ambient air into the chamber through such defect, which could otherwise result in an inconvenience increase in the gaseous impurity concentration in the chamber.

It is a third object of the present invention to provide an exposure apparatus, in which a portion of the apparatus that is sensitive to impurities in ambient air may be placed in a local atmosphere of dehumidified air.

It is a fourth object of the present invention to miniaturize an exposure apparatus by minimizing the space occupied by impurity-removing filter(s) used.

According to a first embodiment of the present invention for achieving the first object described above, there is provided an exposure apparatus for transferring a pattern formed on a mask onto a photosensitized substrate by exposure, comprising: a light source for emitting a light beam having a wavelength falling in a range from ultraviolet to deep ultraviolet radiation; an illumination optical system for directing the light beam from the light source into the mask; an exposure unit for making exposure of a photosensitized substrate in order to transfer the pattern formed on the mask onto the photosensitized substrate; a chamber for housing at least a part of the exposure apparatus; an ambient air introducing unit for introducing ambient air into the chamber; an impurity-removing filter for removing gaseous impurities from one of the gas streams including a stream of ambient air being introduced into the chamber and a gas stream recirculating in the chamber; a pair of impurity-concentration-measuring devices disposed upstream and downstream, respectively, of the impurity-removing filter; and a filter end-of-life determination device for determining end-of-life of the impurity-removing filter based on measurements from the impurity-concentration-measuring device disposed upstream of the impurity-removing filter and measurements from the impurity-concentration-measuring device disposed downstream of the impurity-removing filter.

In the exposure apparatus according to the first embodiment of the present invention for achieving the first object described above, the impurity-removing filter may be preferably arranged for removing gaseous impurities from the stream of ambient air being introduced into the chamber, and wherein the exposure apparatus may preferably further comprise a control device for stopping operation of the ambient air introducing unit when the impurity-concentration-measuring device disposed upstream of the impurity-removing filter has indicated a gaseous impurity concentration above a predetermined level.

According to a second embodiment of the present invention for achieving the first object described above, there is provided an exposure apparatus for transferring a pattern formed on a mask onto a photosensitized substrate by exposure, comprising: a light source for emitting a light beam having a wavelength falling in a range from ultraviolet to deep ultraviolet radiations; an illumination optical system for directing the light beam from the light source into the mask; an exposure unit for making exposure of a photosensitized substrate in order to transfer the pattern formed on the mask onto the photosensitized substrate; a chamber for housing at least a part of the exposure apparatus; an ambient air introducing unit for introducing ambient air into the chamber; an impurity-removing filter for removing gaseous impurities from a stream of ambient air being introduced into the chamber; an impurity-concentration-measuring device disposed upstream of the ambient air introducing unit; and a control device for stopping operation of the ambient air introducing unit when the impurity-concentration-measuring device has indicated a gaseous impurity concentration above a predetermined level.

In the first and second embodiments of the present invention for achieving the first object described above, the impurity-concentration-measuring device may measure concentrations of at least one of impurities including ammonium ion ($NH_4^+$) and sulfate ion ($SO_4^{2-}$), or may measure concentration of organosilicon compounds, such as siloxanes.

According to a third embodiment of the present invention for achieving the second object described above, there is provided an exposure apparatus for transferring a pattern formed on a mask onto a photosensitized substrate by exposure, comprising: a light source for emitting a light beam having a wavelength falling in a range from ultraviolet to deep ultraviolet radiations; an illumination optical system for directing the light beam from the light source into the mask; an exposure unit for making exposure of a photosensitized substrate in order to transfer the pattern formed on the mask onto the photosensitized substrate; a chamber for housing at least a part of the exposure apparatus, the chamber having an air inlet for introducing ambient air into the chamber; a gas-recirculating device disposed in the chamber for producing a gas stream recirculating in the chamber while generating a negative pressure area near the air inlet; and an airtightness-integrity-sensing device for sensing integrity of airtightness of the chamber around the negative pressure area.

In the exposure apparatus according to the third embodiment of the present invention for achieving the second object described above, it may be preferable that the exposure apparatus further comprises a control device for taking, when a failure of integrity of airtightness of the chamber is detected by means of the airtightness-integrity-sensing device, at least one of actions including providing an alarm of a failure of integrity of airtightness and stopping operation of the gas-recirculating device.

This may effectively prevent an accelerated degradation of any impurity-removing filter disposed in the chamber.

Further, in the exposure apparatus according to the third embodiment of the present invention for achieving the second object described above, the airtightness-integrity-sensing device may comprise a differential pressure gauge or an anemometer. the anemometer may be disposed in the air inlet of the chamber. Both of the differential pressure gauge and the anemometer may be used in parallel. If a failure or defect occurs in the sealant used for the chamber, the ambient air leaks into the chamber through the defect, resulting in the corresponding change in the flow rate of the air stream being introduced through the air inlet into the chamber. Thus, the integrity of the airtightness of the chamber may be administrated by sensing the change in the flow rate.

It is preferable that a first gaseous-impurity-removing device is disposed in the air inlet of the chamber and a second gaseous-impurity-removing device is disposed in a flow path of the gas stream recirculating in the chamber. Each of the gaseous-impurity-removing devices may comprise a chemical filter. Chemical filters can remove, unlike HEPA and ULPA filters, gaseous impurities from the environmental gas. Various chemical filters are commonly used including those using fibrous or granulate activated carbon, those utilizing ion exchange reaction provided by various ion exchange resins, those using fibrous activated carbon with some sort of agent added. Examples of the chemical filters utilizing ion exchange reaction are the products having a trademark "EPIX" available from Ebara Corporation in Japan. Examples of the chemical filters using fibrous activated carbon with some sort of agent added are the products bearing a trademark "CLEAN SORB" available from Kondo Kogyo Co, Ltd. in Japan.

This arrangement may be also used to make an inspection of the sealing work of the chamber at the completion of the chamber, and in particular an inspection of the sealant applied to the joints between panels constituting the chamber wall.

According to a fourth embodiment of the present invention for achieving the third object described above, there is provided an exposure apparatus for transferring a pattern formed on a mask onto a photosensitized substrate by exposure, comprising: a light source for emitting a light beam having a wavelength falling in a range from ultraviolet to deep ultraviolet radiations; an illumination optical system for directing the light beam from the light source into the mask; an exposure unit for making exposure of a photosensitized substrate in order to transfer the pattern formed on the mask onto the photosensitized substrate; a chamber for housing at least a part of the exposure apparatus; and a gas supply device for supplying dehumidified gas to a desired area around the exposure apparatus.

However, when the moisture in an semiconductor device factory or in an exposure apparatus is completely eliminated, electrostatic discharges are likely to occur. Semiconductor devices are subject to failures caused by electrostatic discharge, such as destruction of the chips and functional failures of circuits in the chips, so that any electrostatic charge may result in a reduced yield of the semiconductor devices. On the other hand, filing all the area in the apparatus all the time with some sort of dry gas is very costly.

Therefore, in this embodiment, it is preferable that only the local atmosphere around the photosensitized substrate and/or the local atmosphere around the illumination optical system are/is filled with the dehumidified gas. Further, the dehumidified gas may preferably comprise dehumidified ambient air. One typical method of dehumidifying the ambient air is to cool an amount of the ambient air to a very low temperature about −30 to −40° C. so as to freeze any moisture in the air into ice and remove from the air. A sensing device for sensing the existence of the photosensitized substrate may be provided and the supply of the dehumidified gas may be controlled depending on presence/absence of the photosensitized substrate. The dehumidified gas may be generated by causing a gas stream to pass through a gaseous-impurity-removing filter and then through a dehumidifier. In the case where a plurality of exposure apparatuses are equipped in a factory, the dehumidifier for generating the dehumidified gas may comprise a plurality of dehumidifying unit each provided for one of the exposure apparatuses, or may comprise a single dehumidifying unit common to all the exposure apparatuses for generating the dehumidified air and distributing it to them.

In order to avoid any electrostatic discharge, it is preferable that an antistatic device is provided for such parts that are likely to accumulate electrostatic charge by friction, such as the parts which come into contact with the photosensitized substrate in a local atmosphere in the area to which the dehumidified gas is supplied. The antistatic device may be a device for grounding such parts.

In this arrangement, only selected area(s) will undergo dehumidification, so that the dehumidification can be effectively performed and the reduction in nonuniformity among the resist images and the reduction in the contamination of the optical elements can be achieved because any contamination by the impurities conveyed by water particulates or by the moisture itself is eliminated.

Further, in the case where purified dehumidified gas is generated by causing a gas stream to pass through a gaseousimpurity-removing filter and then through a dehumidifier, any contamination of the apparatus may be reduced more effectively. Chemical filters be used as the gaseous-impurity-removing filter, and it can remove, unlike HEPA and UL,PA filters, gaseous impurities from the environmental gas. Various chemical filters are commonly used including those using fibrous or granulate activated carbon, those utilizing ion exchange reaction provided by various ion exchange resins, those using fibrous activated carbon with some sort of agent added. Examples of the chemical filters utilizing ion exchange reaction are products bearing a trademark "EPIX" available from Ebara Corporation in Japan. Examples of the chemical filters using fibrous activated carbon with some sort of agent added are products bearing a trademark "CLEAN SORB" available from Kondo Kogyo Co, Ltd. in Japan. Gaseous impurities to be removed by the chemical filter include $SO_4^{2-}$, $NH_4^+$, organosilicom compounds, trimethylsilanol, N-methyl-2-pyrrolidon and others.

In addition, the supplied dehumidified gas may typically comprise dehumidified ambient air, with the result that a possible leakage of the dehumidified gas into a factory room will never risk the workers in the room. This also provides an advantage that the use of such dehumidified gas is less costly than the use of nitrogen or helium gas.

According to a fifth embodiment of the present invention for achieving the fourth object described above, there is provided an air-conditioning apparatus for removing impurities from gas, adapted for effecting air-conditioning to a semiconductor device factory and/or an exposure apparatus, comprising: a body housing; a gas supply duct housed in the body housing; and an impurity-removing filter element disposed inside the gas supply duct.

According to a sixth embodiment of the present invention for achieving the fourth object described above, there is provided an exposure apparatus for transferring a pattern formed on a mask onto a photosensitized substrate by exposure, comprising: a light source for emitting a light beam having a wavelength falling in a range from ultraviolet to deep ultraviolet radiations; an illumination optical system for directing the light beam from the light source into a mask; an exposure unit for exposing a photosensitized substrate in order to transfer the pattern formed on the mask onto the photosensitized substrate; a chamber for housing at Least a part of the exposure apparatus; and an air-conditioning apparatus for effecting conditioning of gas in the chamber, said air-conditioning apparatus being disposed outside the chamber and comprising a body housing, a gas supply duct housed in the body housing and an impurity-removing filter element disposed inside the gas supply duct.

The impurity-removing filter element may comprise a hollow cylindrical body or may comprise a bellows wall. Further, the impurity-removing filter element may be so supported by a support member as to be kept out of contact with an inner wall of the gas supply duct. The duct is bendable with the impurity-removing filter element contained therein. A filter element having a hollow cylindrical body has a relatively large filtering surface area and is effective to reduce the pressure loss across the filter element.

The impurity-removing filter element may be a gaseous-impurity-removing element, or may be a combined filter element comprising a gaseous-impurity-removing filter element and a particulate filter element. Further, the gaseous-impurity-removing filter element may comprise a chemical filter using some sort of ion exchange resin, or a chemical filter using fibrous activated carbon with some sort of agent added, for removing gaseous impurities such as ammonia, basic amines, sulfate ion, N-methyl-2-pyrrolidon, trimethylsilanol and others. The particulate filter may comprise a HEPA filter or an ULPA filter.

According to this embodiment, an impurity-removing filter element may be disposed in an air-conditioning apparatus at a space inside an existing duct, occupying no other space which may be utilized for other purposes. An air-conditioning apparatus according to this embodiment may be used with an exposure apparatus or with a clean room.

BRIEF DESCRIPTION OF THE DRAWINGS

The above and other objects, features and advantages of the present invention will be apparent from the following detailed description of preferred embodiments thereof, reference being made to the accompanying drawings, in which:

FIG. 13 is a schematic representation of an exemplified impurity-removing filter provided at an air inlet of an exposure apparatus showing the fourth embodiment of the present invention;

FIG. 14 is a schematic representation of a further exemplified exposure apparatus showing the fourth embodiment of the present invention;

DETAILED DESCRIPTION OF THE INVENTION

The above and other objects, features and advantages of the present invention will be apparent from the following detailed description of preferred embodiments thereof.

The present invention will be now described in more detail with reference to preferred embodiments.

Figure 1:
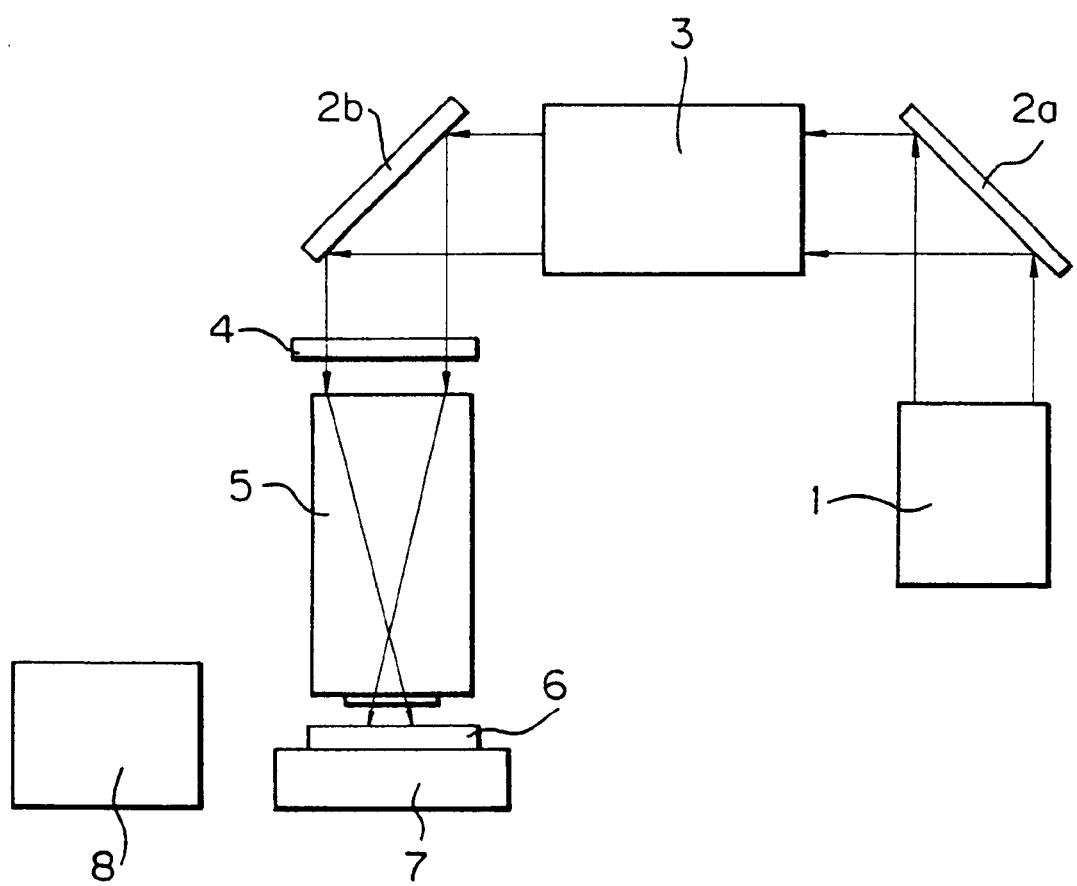
FIG. 1 is a schematic representation of an optical system for an exposure apparatus showing a first embodiment of the present invention.
Figure 2:
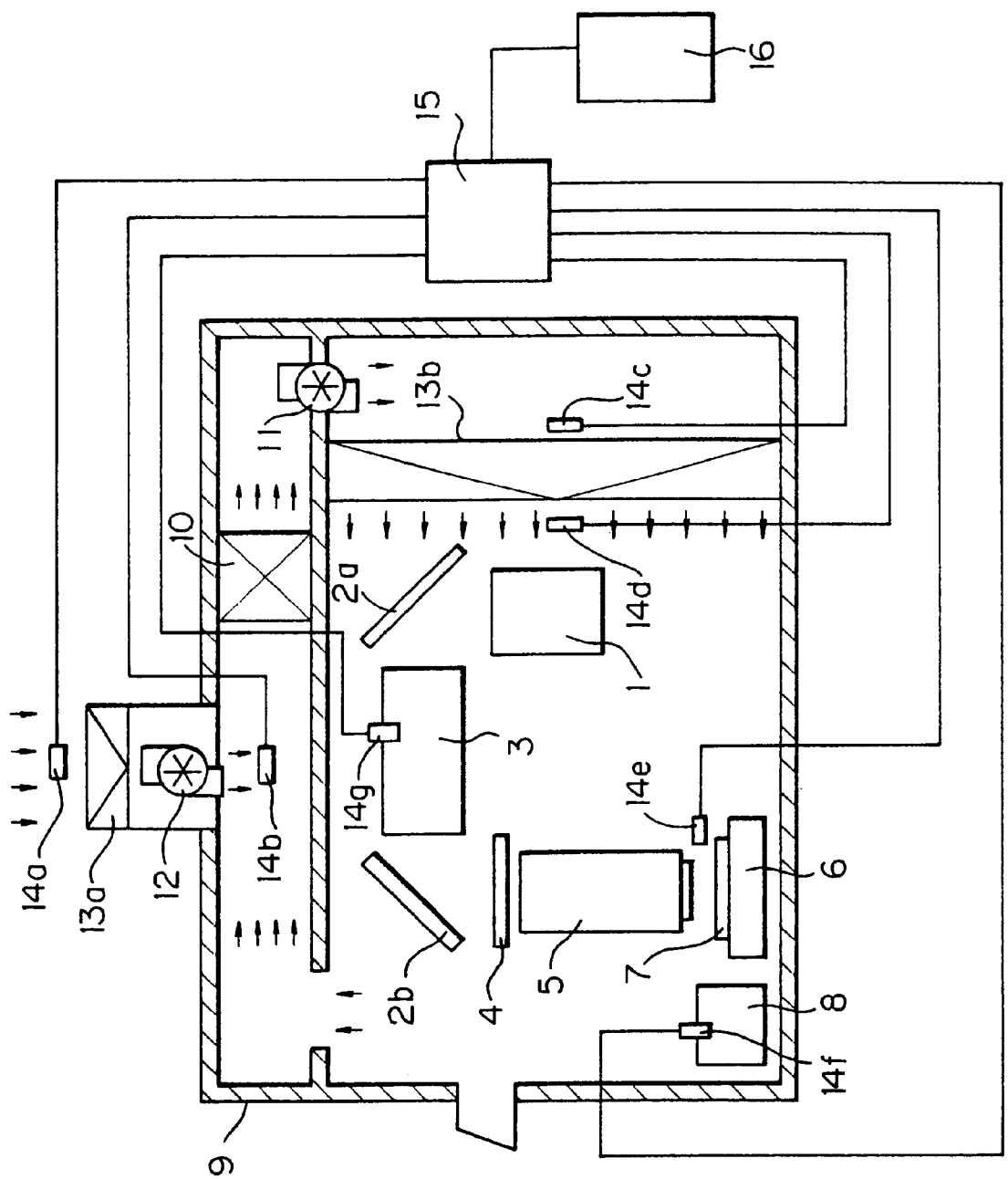
FIG. 2 is a schematic representation of an exemplified exposure apparatus showing the first embodiment of the present invention.

Referring now to FIGS. 1 and 2, an exposure apparatus according to a first embodiment of the present invention is described, which is useful for achieving the first object of the present invention described above.

FIG. 1 is a schematic representation showing an exemplified exposure apparatus. A DUV light source 1, which may be an excimer laser or a mercury lamp, emits a light beam. The light beam is reflected by a first mirror 2a into an illumination optical system 3 which comprises an illuminance equalizer (which may be an optical integrator (a fly-eye lens, for example) or a condenser lens), various lenses and mirrors. The illumination optical system 3 shapes the received light beam into an illumination light beam having uniform illuminance over its entire cross section. The illumination light beam exits the illumination optical system 3 and is again reflected by a second mirror 2b into a reticle 4. The reticle 4 has a pattern formed thereon and is illuminated uniformly by the illumination light beam. The pattern on the reticle 4 is projected through a projection lens 5 onto a photosensitized substrate 6, and an image of the pattern is formed on and transferred to the substrate 6. The substrate 6 may be, typically, a wafer having a layer of resist formed thereon, and thus we call it "wafer" hereinafter. The wafer 6 is carried on a two-dimensionally movable XY-stage 7. Before undergoing the exposure process the wafer 6 is located at the waiting location, and after having undergone an exposure process the wafer 6 is again returned to the waiting location 8.

FIG. 2 is a schematic representation showing a first embodiment according to the present invention. The exposure apparatus of FIG. 1 is confined in the chamber 9, the inside of which is maintained at a fixed temperature by means of an air-conditioning apparatus 10. The ambient air outside the chamber 9 may be introduced into the chamber 9 through an air inlet by means of a first gas-delivering fan 12, and the gas in the local atmosphere in the chamber 9 is recirculated by means of a second gas-delivering fan 11. The air inlet is provided with an impurity-removing unit 13a for removing impurities from the air stream being introduced into the chamber 9 through the air inlet. A second impurity-removing unit 13b is provided in the chamber 9 for removing impurities from the gas stream recirculating in the chamber 9. The chamber 9 of FIG. 1 houses the entire exposure apparatus; however, instead of the chamber 9 a modified chamber may be used which houses only a part of the exposure apparatus, such as the illumination optical system 3 only.

Each of the impurity-removing units 13a and 13b includes an impurity-removing filter for removing gaseous impurities, which may be any suitable one of chemical filters such as those using fibrous or granular activated carbon, those utilizing the ion-exchange reaction of some sort of ion-exchange resin and those using fibrous activated carbon with some sort of agent added, or may be a filter utilizing the electrostatic adsorption wherein a gas stream is directed to flow between positive and negative electrodes such that any gaseous impurities are adsorbed to the electrodes and removed from the gas stream.

For example, products bearing a trademark "CLEAN SORB" available from Kondo Kogyo Co, Ltd. in Japan include a basic-gas-removing chemical filter which may be used for removing various basic gasses such as ammonia, and a sulfur-gas-removing chemical filter which may be used for removing sulfur dioxide gas ($SO_2$). If either ammonia or sulfur oxides ($SO_x$) can be completely removed or eliminated from the gas in the chamber 9, the glass optical elements used in the chamber 9 will be free from being blurred by the formation of a deposit layer of ammonium sulfate (($NH_4)_2SO_4$) or the like on their surfaces. Further, an activated carbon filter may be used to remove organosilicon such as siloxanes and silanoles, so that the glass optical elements will be free from being blurred by the formation of a deposit layer of silicon dioxide and the like on their surfaces.

Two gaseous impurity-concentration-measuring devices 14a and 14b are used, one disposed at a position upstream of the first impurity-removing unit 13a (that is, disposed in the ambient air in the environment of the exposure apparatus) and the other at a position downstream of the first impurity-removing unit 13a. There are provided additional two gaseous impurity-concentration-measuring devices 14c and 14d disposed at position upstream and downstream, respectively, of the second impurity-removing unit 13b. The measurements obtained through the impurity-concentration-measuring units 14a, 14b, 14c and 14d are sent to an arithmetic operation unit 15, which uses the received measurements to calculate the impurity removal efficiency of the gaseous-impurity-removing filters used in the impurity-removing units 13a and 13b in order to determine end-of-life of each filter elements used therein.

The impurity-concentration-measuring devices 14a–14d may be of any known type. For example, a measurement device may be used which includes a crystal resonator having a synthetic bilayer membrane (which is similar to a lipid molecular membrane) formed thereon, and the amount of impurities adsorbed on the membrane causes the corresponding change in the resonance frequency of the crystal resonator and thus can be detected electrically. If it is desired to measure individual concentrations of different impurities, a plurality of such measurement devices may be used. Alternatively, the gas may be sampled at the concentration-measuring points and analyzed by means of the gas chromatography or the spectrophotometry in order to determine individual impurity concentrations in the gas.

Figure 25:
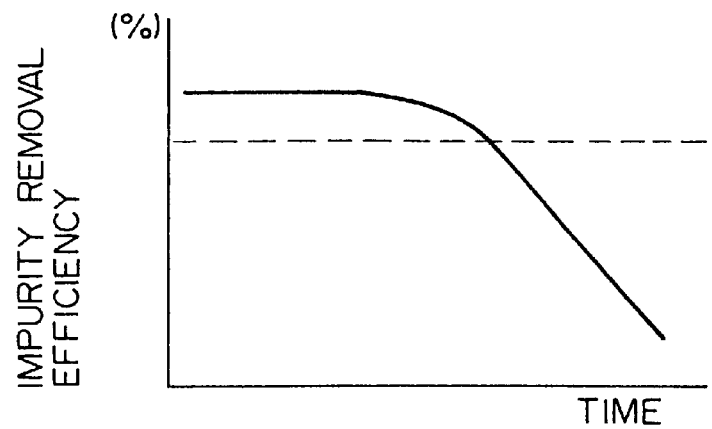
FIG. 25 is a plot illustrating the change of the impurity removal efficiency of a chemical filter with time.
Figure 26:
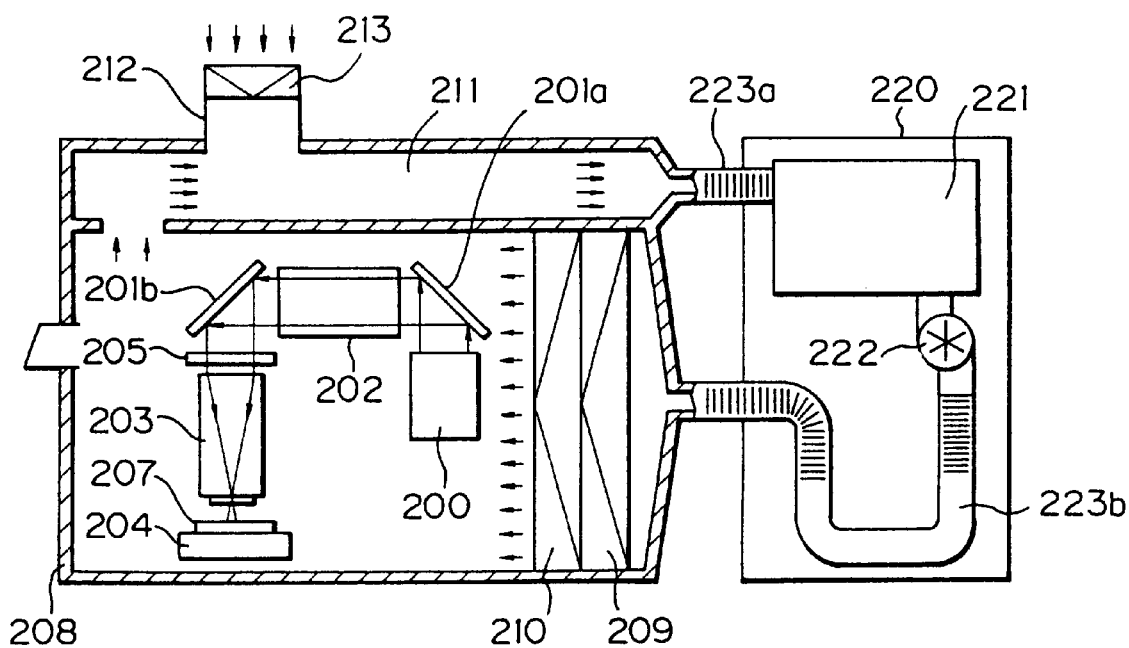
FIG. 26 is a schematic representation showing a typical prior art exposure apparatus.

Next, we will describe the method of determining end-of-life of an impurity-removing filter. In general, the impurity removal efficiency of an impurity-removing filter will decreases with time as the removed impurities are accumulated more in the filter, as shown by the curve in FIG. 25. The arithmetic operation unit 15 makes calculations to determine the current impurity removal efficiency of each of the impurity-removing unit 13a and 13b based on the following the equation.

$$\text{impurity removal efficiency}(\%) = \left(1 - \frac{\text{downstream gaseous impurity concentration}}{\text{upstream gaseous impurity concentration}}\right) \times 100$$

That is, the difference between the gaseous impurity concentration measured at the measuring point downstream of that impurity-removing unit (i.e., the gaseous impurity concentration in the gas stream after having passed through the filter) and the gaseous impurity concentration measured at the measuring point upstream of the unit (i.e., the gaseous impurity concentration in the gas stream just before passing through the filter) is calculated, and then the difference is divided by the gaseous impurity concentration measured at the measuring point upstream of the unit.

Figure 3:
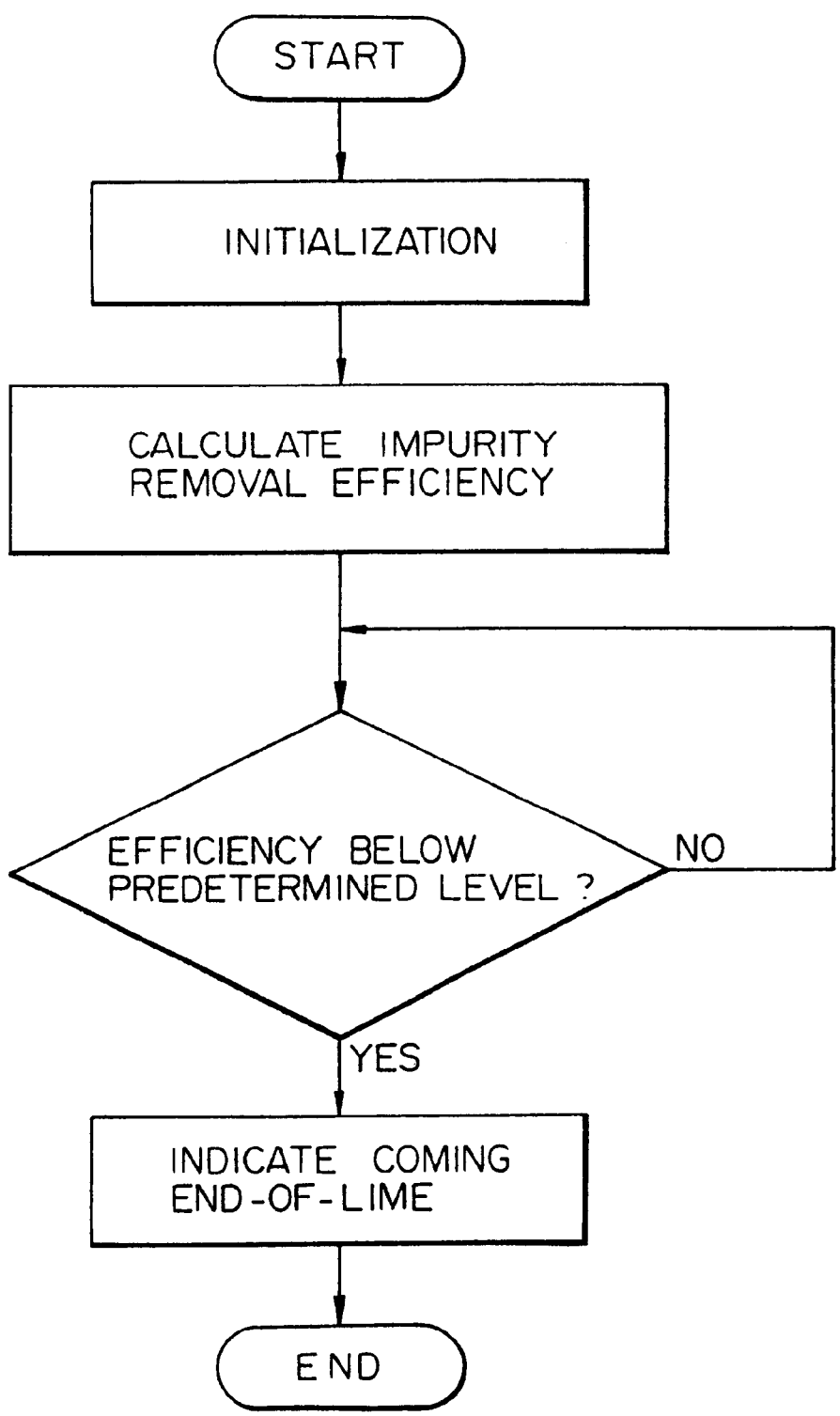
FIG. 3 is a flow chart illustrating an sequence of operations of the exposure apparatus shown in FIG. 2.

Then, the end-of-life of the impurity-removing unit is defined as the point of time when the impurity removal efficiency decrease to a predetermined level, such as 90%. The arithmetic operation unit 15 calculates the impurity removal efficiency of each of the impurity-removing units 13a and 13b, either continuously or iteratively at regular intervals, from the measurements obtained through the impurity-concentration-measuring devices, and when the impurity removal efficiency has decreased to a level near 90%, such as 91% level, it causes the control panel to display an indication of the decrease of the impurity removal efficiency of the corresponding gaseous impurity-removing device 13a or 13b (See flow chart in FIG. 3). The operator of the apparatus is taught by the indication that the end-of-life of that gaseous impurity-removing device is coming soon. The indication may be, in addition to the visual indication by the display, a sound alarm such as a buzzer note, a synthetic voice warning, and others.

Additional impurity-concentration-measuring devices 14e, 14f and 14g may be provided at those positions which are not related to the impurity-removing devices 13a and 13b but are subject to possible contamination by the impurities, such as positions near the XY-stage 6, near the wafer waiting location 8, within the illumination optical system 3 and others.

End-of-life of the impurity-removing devices 13a and 13b may be determined in another way. That is, the impurity concentration measurements are performed at the positions near those parts of the exposure apparatus which are likely to be contaminated, and the end-of-life of the impurity-removing devices 13a and 13b is determined when one of the measured impurity concentrations has reached a predetermined level. In this case, an indication may be made when one of the measured impurity concentrations has reached or are reaching the predetermined level, so that the operator can recognize from the indication that it is to replace the gaseous-impurity-removing filter elements. Further, the apparatus may be stopped when the measured impurity concentration(s) has/have exceeded the end-of-life level, so as to prevent contamination inside the apparatus.

Figure 4:
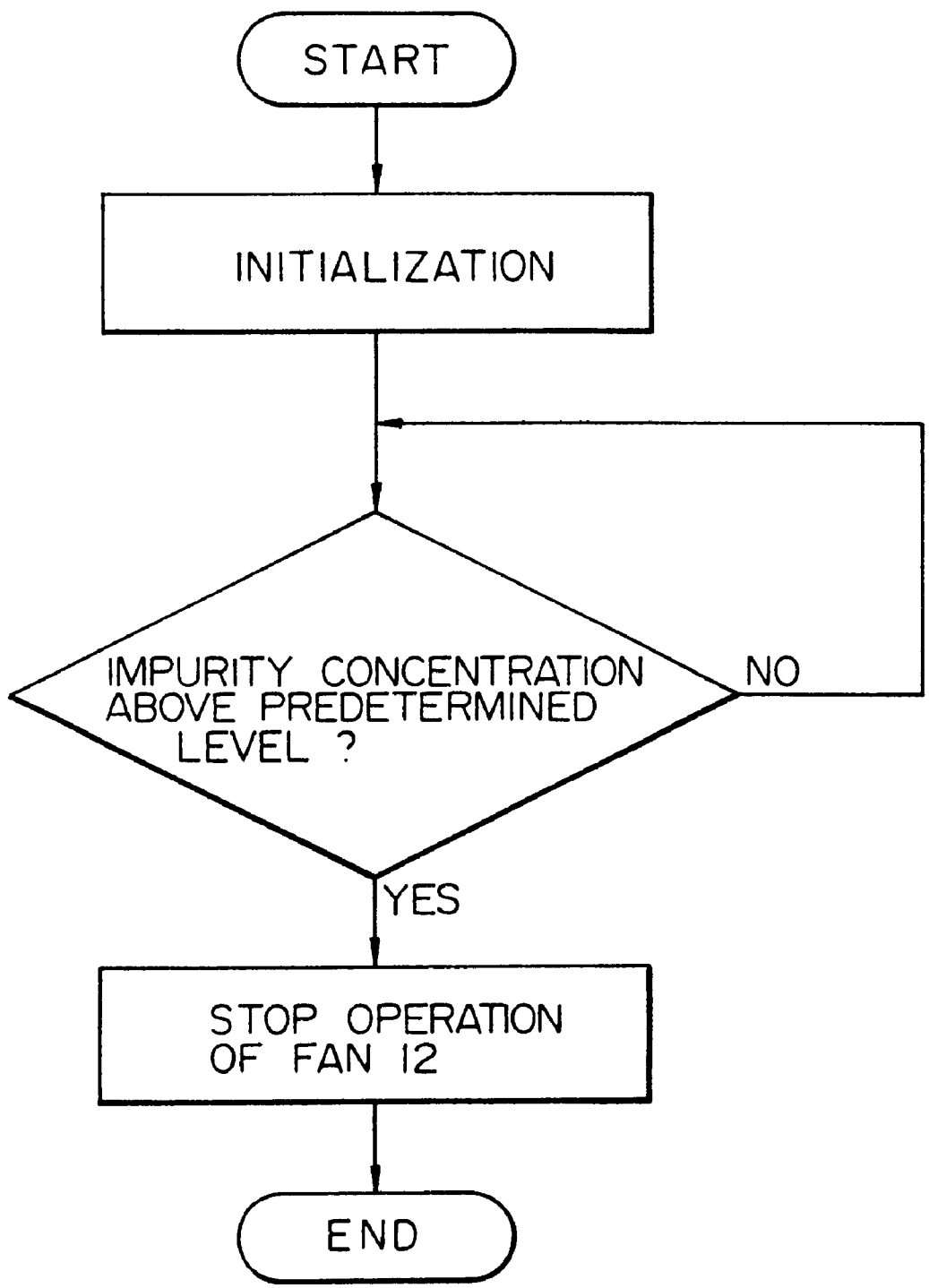
FIG. 4 is a flow chart illustrating another sequence of operations of the exposure apparatus shown in FIG. 2.

A further additional impurity-concentration-measuring device may be provided outside the chamber 9 to measure the impurity concentration in the environmental air of the chamber 9, so that any abnormally abrupt increase in the impurity concentration in the air surrounding the apparatus may be detected as one of the abnormalities in the apparatus environment. Although ambient air is introduced into the chamber through the impurity-removing device, an abnormally high level of gaseous impurity concentration in the ambient air, which may be caused for some reason or another, may result in the contamination inside the apparatus. Thus, it is preferable to stop the operation of the gas-delivering fan 12 used for introducing the ambient air into the chamber 9, so as to stop air introduction to prevent the contamination inside the apparatus (see flow chart in FIG. 4). In the arrangement of FIG. 1, the impurity-concentration-measuring device 14a, which is disposed at the position upstream of the impurity-removing device 13a, may be used as the ambient air impurity-concentration-measuring device.

As described above, in the above exposure apparatus, impurity-concentration-measuring devices are used to measure the impurity concentrations in the gas inside the apparatus and in the ambient air, so that the end-of-life of the impurity-removing filter may be administrated in an appropriate manner. Further, the impurity concentrations in the ambient air outside the apparatus may be monitored, so that quick and appropriate actions may be taken against any abnormalities occurring in the environment of the exposure apparatus.

Figure 5:
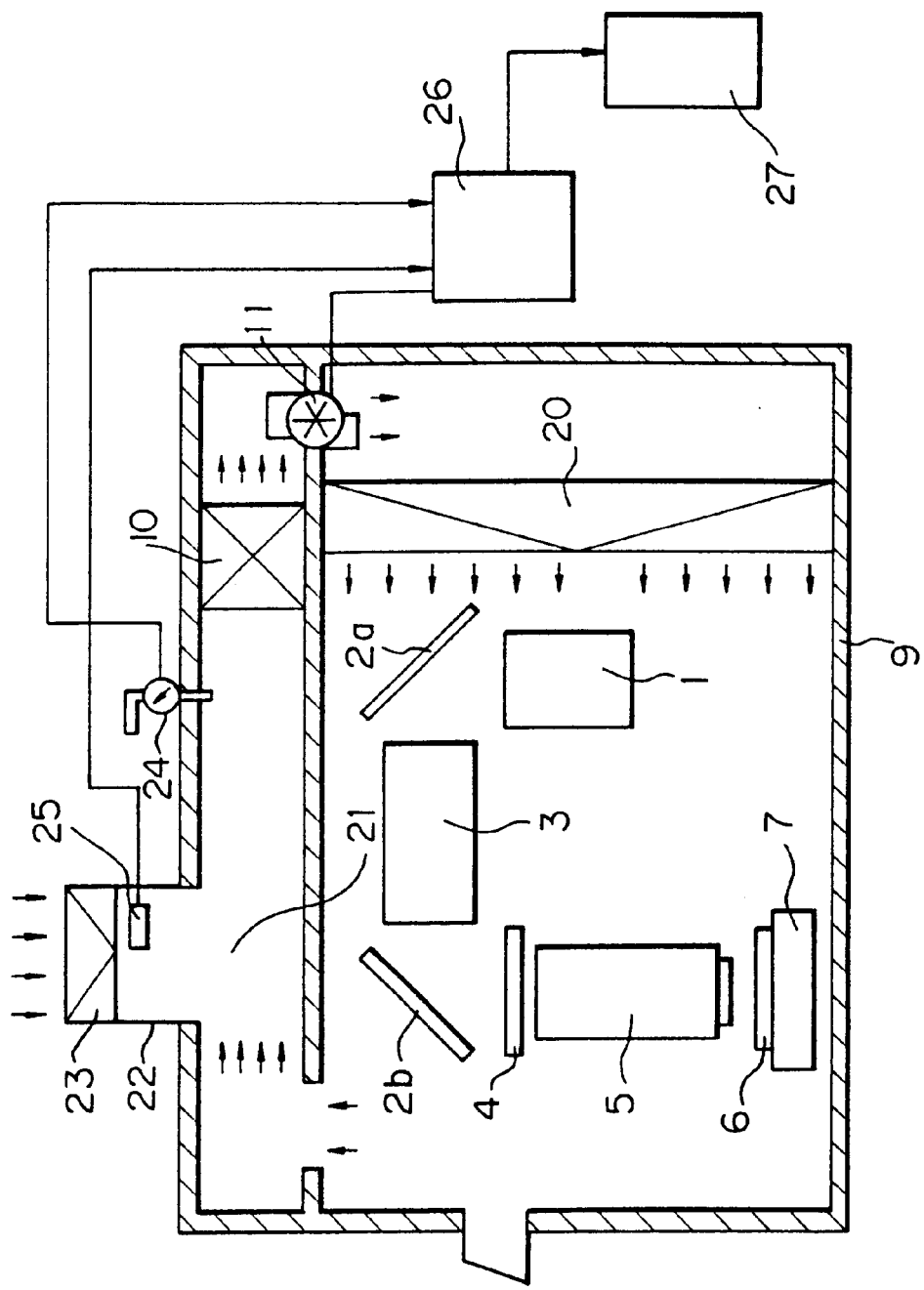
FIG. 5 is a schematic representation of an exemplified exposure apparatus showing a third embodiment of the present invention.

Referring next to FIG. 5, we will describe an exposure apparatus according to another embodiment of the present invention, which is useful to achieve the second object of the present invention described above.

FIG. 5 is a schematic representation showing the exposure apparatus of the embodiment having the exposure unit of FIG. 1 confined in a chamber. A wafer waiting location is defined at an appropriate position but is not shown.

The air within the chamber 9 is temperature-controlled by an air-conditioning apparatus 10 disposed in the chamber 9, and then delivered by a gas-delivering fan 11 to pass through an impurity-removing device 20 including a chemical filter and a particulate filter to be the atmosphere of the exposure unit. Because of the pressure increase caused by the gas-delivering fan 11, the atmosphere surrounding the exposure unit is maintained at a pressure level greater than the air pressure level outside the chamber 9. Thus, any failure in an air tight seal at an edge of a door or between panels surrounding the atmosphere of the exposure unit would only result in leakage out of the chamber 9, and no ambient air, which generally contains dusts and gaseous impurities, is sucked in and allowed to leak into the chamber 9. The air supplied from the impurity-removing device 20 to the local atmosphere around the exposure unit then flows through a return passage 21 into the air-conditioning apparatus 10, and then again temperature-controlled by the air-conditioning apparatus 10 and delivered by the gas-delivering fan 11, so as to recirculate within the chamber 9.

Because the gas-delivering fan 11 delivers air at a considerable flow rate, the pressure in the space upstream of the gas-delivering fan 11 is maintained to be a negative pressure with respect to the air pressure outside the chamber 9. This negative pressure serves to draw the ambient air into the chamber 9 through the air inlet 22, so that air is supplied from the outside of the chamber 9 at the same rate as the air in the space surrounding the exposure unit escapes out of the chamber 9. The air inlet 22 is provided with an impurity-removing filter 23 including a gaseous-impurity-removing filter element and a particulate filter element, and the ambient air is introduced into the chamber 9 through the impurity-removing filter 23.

The embodiment of FIG. 5 includes a differential pressure gauge 24 between the negative pressure area in the chamber 9 and the outside of the chamber 9 for measuring the pressure difference between them. Further, it includes an anemometer 25 disposed near the air inlet 22 for measuring the speed of the stream of the ambient air flowing through the air inlet 22 into the chamber 9, from which the flow rate of the air stream may be determined. The outputs from the differential pressure gauge 24 and from the anemometer 25 are supplied to the control unit 26.

Figure 6:
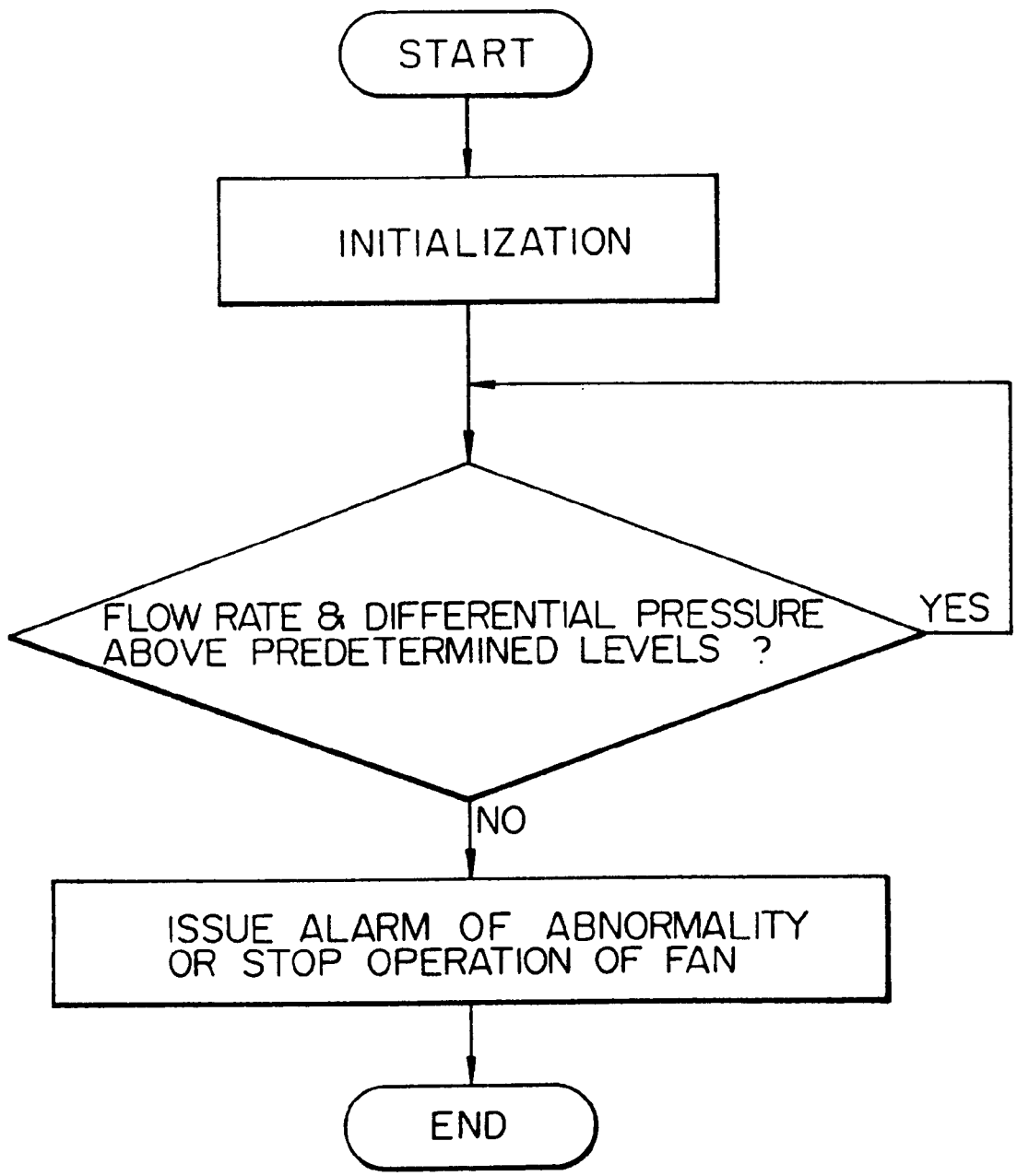
FIG. 6 is a flow chart illustrating a sequence of operations of the exposure apparatus shown in FIG. 5.

If a failure such as a breakage has occurred in the sealant used to seal the joints between the panels of the chamber wall defining the negative pressure area in the chamber 9, then an opening may be formed in the sealant by such breakage and the ambient air may be drawn into the chamber through the opening under the influence of the negative pressure. This leakage of air into the chamber through the chamber wall results in the pressure increase in the negative pressure area, which in turn causes the decrease in the flow rate of the air stream flowing into the chamber through the air inlet 22. The control device 26 monitors the flow rate and the pressure difference between the negative pressure area and the outside of the chamber, so that when a change or changes are detected in at least one of these factors the control unit 26 outputs a signal to an alarm unit 27 so as to indicate the abnormality to the operator of the apparatus. Alternatively, upon detection of an abnormality, the control unit 26 may stop the operation of the fan 11 so as to cause the negative pressure area to disappear and prevent the leakage of air into the chamber through the sealant breakage (see flow chart in FIG. 6).

In the arrangement of the embodiment of FIG. 5, the chamber houses the entire exposure unit. A modification may be made wherein only a part of the exposure unit is confined in the chamber and some of the components of the exposure unit such as a light source 1 and a power supply (not shown), which generally produce a considerable amount of heat, are disposed outside the chamber 9.

As clearly understood from the above, the integrity of the airtightness of the chamber is continuously monitored and any impurities are prevented from entering into the chamber, so that any contamination inside the apparatus and degradation of impurity filters, which could otherwise occur due to a failure of the integrity of airtightness of the chamber, are effectively prevented.

Referring next to FIGS. 7 to 14, we will describe an exposure apparatus according to a further embodiment of the present invention, which is useful to achieve the third object of the present invention described above.

Figure 7:
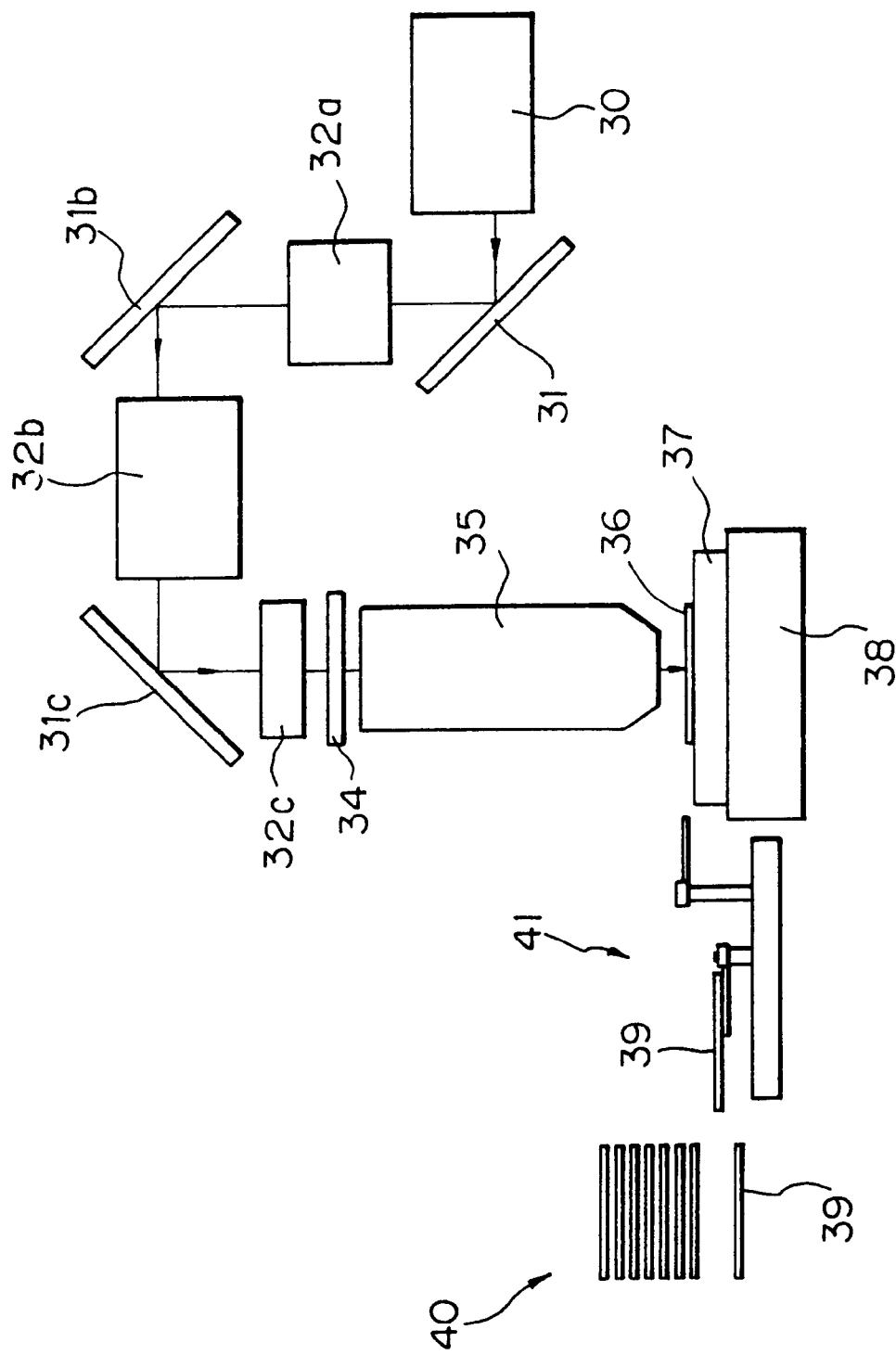
FIG. 7 is a schematic representation of an optical system for an exposure apparatus showing a fourth embodiment of the present invention.

FIG. 7 is a schematic representation showing an exposure apparatus. The exposure apparatus includes a light source 30 for emitting deep ultraviolet light, which may be an excimer laser or a mercury lamp. The light emitted from the light source 30 passes through various lenses 32a–32c while being reflected by mirrors 31a–31c, which lenses 32a–32c and mirrors 31a–31c together constitute an illumination optical system, so that the light is shaped by means of the illumination optical system into a uniform illuminance light beam. The uniform illuminance light beam exiting the illumination optical system illuminates, with a uniform illuminance, a reticle 34 having a pattern formed thereon. The pattern on the reticle 34 is projected through a projection lens 35 onto the photosensitized substrate 36, so that an image of the pattern is formed on and transferred to the substrate 36. The photosensitized substrate 36 may be a wafer with a layer of resist formed on its surface, so that we call it "wafer" hereinafter. The wafer 36 is carried on a two-dimensionally movable XY-stage 38. Before exposure the wafer 36 is placed at a wafer waiting location 40, and after exposure the wafer 36 is again returned to the wafer waiting location 40. Conveyance of the wafer between the wafer waiting location 40 and the wafer holder 37 on the stage 38 is made by means of a wafer conveyor 41.

Figure 8:
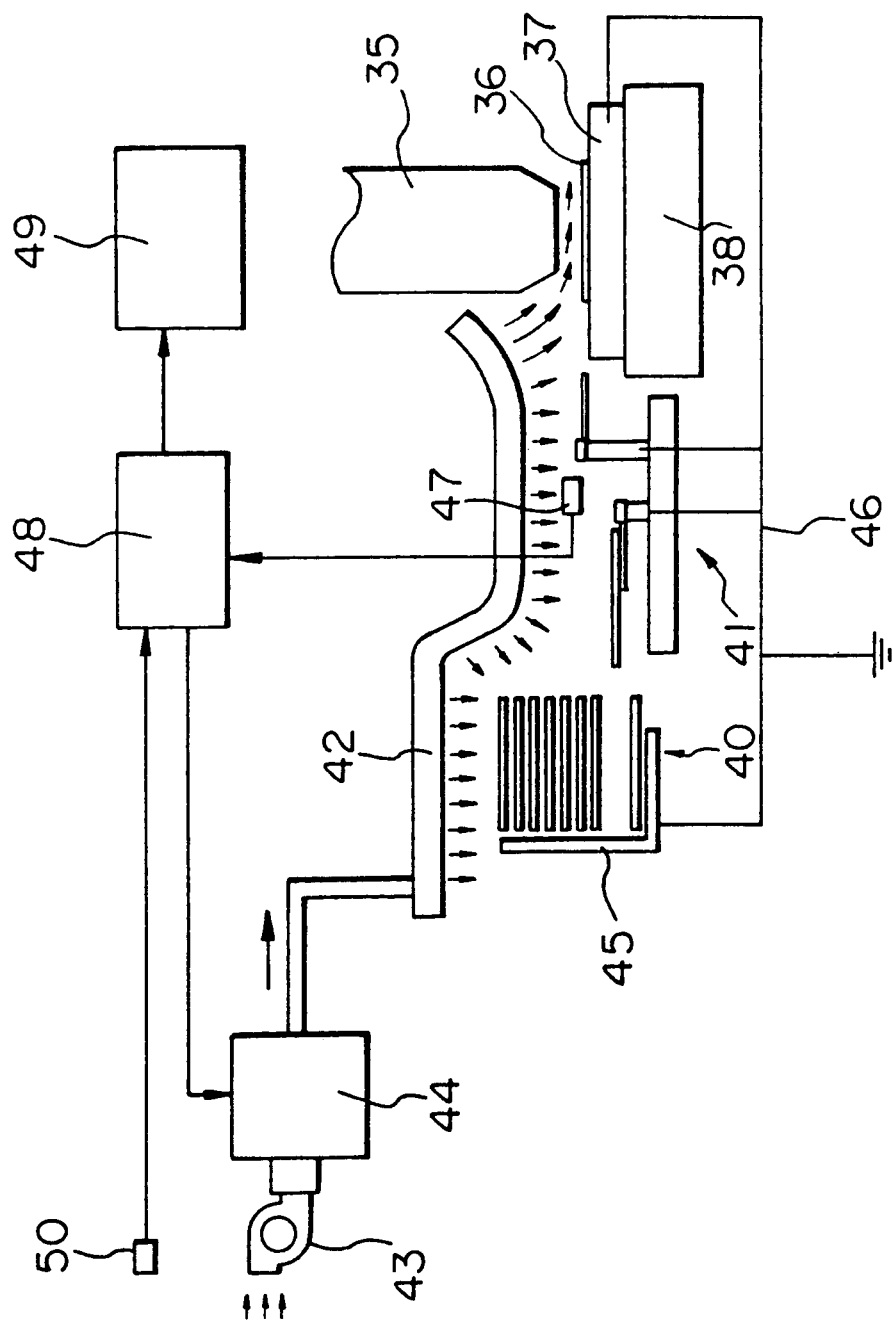
FIG. 8 is a schematic representation of an exemplified exposure apparatus showing the fourth embodiment of the present invention.
Figure 9:
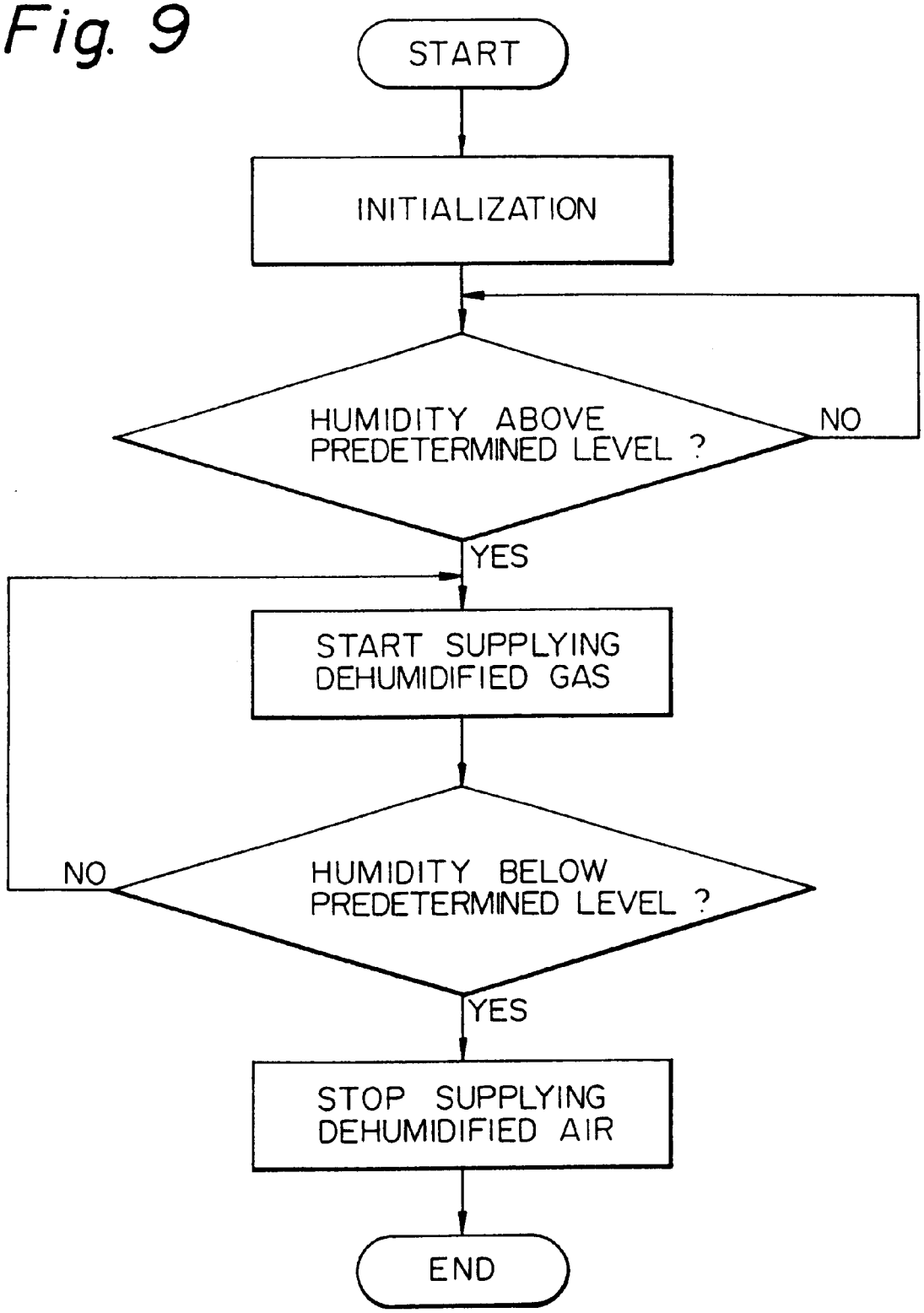
FIG. 9 is a flow chart illustrating a sequence of operation of the exposure apparatus shown in FIG. 8.

FIG. 8 is a schematic representation showing a fourth embodiment of the present invention as applied to the exposure apparatus shown in FIG. 7.

Each wafer 36 being transferred into the exposure apparatus is first placed at the wafer waiting location 40, and thence conveyed by the wafer conveyor 41 onto the stage 38 and held thereon. Then, an image of the reticle pattern is projected through the projection lens 35 onto the wafer 36.

A dry air blower 42 is disposed above the wafer conveyance path between the wafer waiting location 40 and the stage 38. The dry air blower 42 may comprise one or more pipes having a downwardly facing pipe wall portion perforated to form therein a lot of tiny holes, or alternatively may comprise a rectangular duct having a bottom in which a lot of tiny holes or small slits are formed. The ambient air is drawn by an gas-delivering fan 43 and delivered to a dehumidifier 44 which dehumidify the air to a humidity of a few percent. The dehumidified air is then downwardly blown by the dry air blower 42 at a flow rate which is sufficient to fill the space providing atmosphere for the wafer. In the embodiment of FIG. 8, a single dry air blower 42 is used to cover all of the wafer waiting location 40, the wafer conveyor 41 and the stage 38. Alternatively, individual dry air blowers may be used each to cover one of the wafer waiting location 40, the wafer conveyor 41 and the stage 38. The direction of the air stream blown out of the dry air blower 42 may be any of the directions which may be used to fill the space providing atmosphere for the wafer.

Electrostatic discharges are likely to occur in the atmosphere composed of dehumidified air, and may arise a problem that an electrostatic discharge through a wafer may destroy the devices formed on the wafer or cause functional failures of some circuits in the devices. In view of this, all the components which may contact with the wafer, such as a wafer case 45, the wafer conveyor 41 and the wafer holder 37, as well as some of the movable components, are made of conductive material such as metals and grounded so as to avoid any electrostatic charges.

A hygrometer (or humidity-measuring device) 47 is disposed in the wafer process atmosphere in order to continuously monitor the humidity in that atmosphere. The control device 48 send a signal to the alarm unit 49 when an increase in the humidity is detected by the hygrometer 47, so that the operator of the apparatus may recognize the humidity increase in the wafer process atmosphere. An additional hygrometer (or humidity-measuring device) 50 may be disposed near the air entrance opening of the gas-delivering fan 43. The control device 48 monitors the humidity in the ambient air based on the output of the hygrometer 50 in order to control the dehumidifying power of the dehumidifier 44 such that the humidity of the wafer process atmosphere may be maintained at a constant level irrespective of the humidity of the ambient air (see flow chart of FIG. 9).

Figure 10:
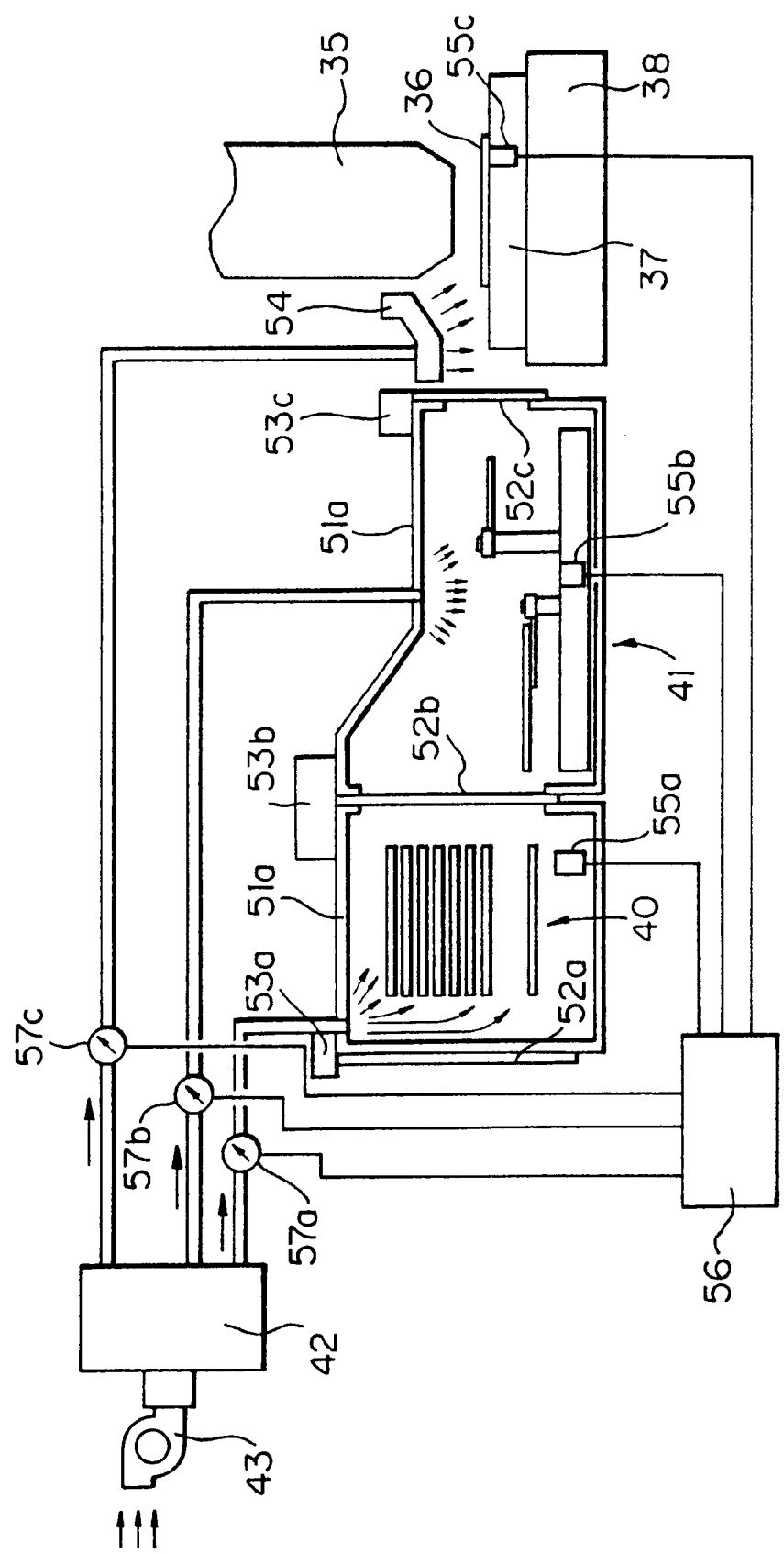
FIG. 10 is a schematic representation of another exemplified exposure apparatus showing the fourth embodiment of the present invention.
Figure 11:
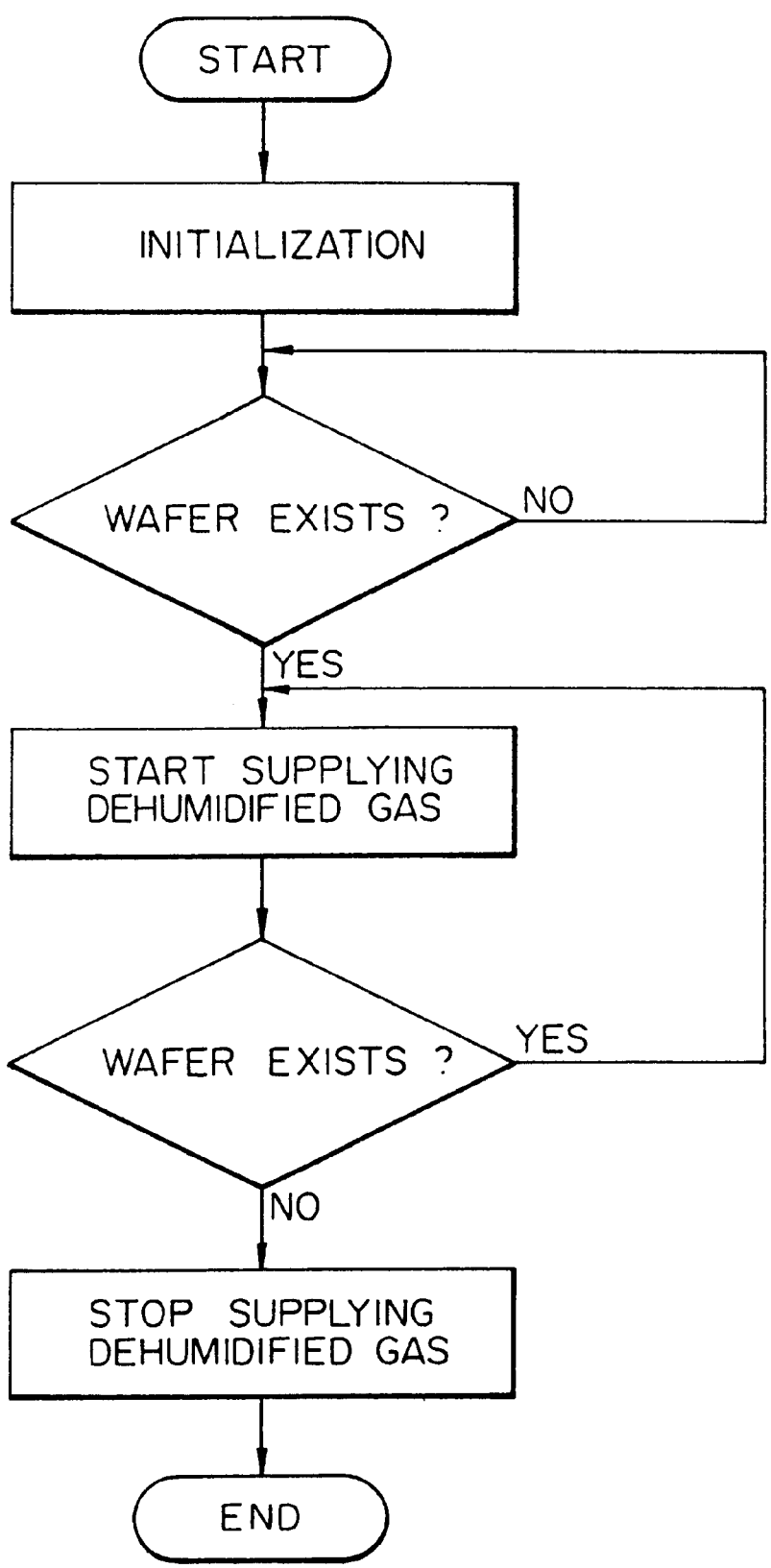
FIG. 11 is a flow chart illustrating a sequence of operations of the exposure apparatus shown in FIG. 10.

FIG. 10 is a schematic representation showing another exemplified exposure apparatus according to the fourth embodiment of the present invention.

In the arrangement shown in FIG. 10, the wafer waiting location 40 and the space for the wafer conveyor 41 are individually housed in respective chambers 51a and 51b which are filled with dry air dehumidified to a humidity of a few percent. As with the embodiment of FIG. 8, the ambient air is drawn by an gas-delivering fan 43 and delivered to a dehumidifier 42 which dehumidify the air so as to provide the dry air. Three shutters 52a, 52b and 52c are provided between the chamber 51a and the outside, between the chambers 51a and 51b and between the chamber 51b and the outside, respectively. The shutters 52a–52c open individually by means of respective shutter actuators 53a–53c only when a wafer enters or exits any of the chambers 51a and 51b. At other times, the shutters 52a–52c are kept closed. Because of the division of the entire space into two individual blocks defined by the chambers 51a and 51b, each chamber has the smaller volume and thus may be ventilated with the dry air in an efficient manner. In addition, the pressure in each chamber is maintained at a pressure a little greater than the ambient air pressure, such that the moisture in the ambient air is prevented from entering the chamber. Because the stage 36, which is surrounded by many movable parts, is difficult to house in a chamber, a dry air blower 54 is used which is disposed above the stage 38 and serves to blow the dehumidified, dry air into the atmosphere for the wafer 36 placed on the stage 8.

Wafer detectors 55a, 55b and 55c are provided for determining as to whether a wafer 36 exists at the wafer waiting location 40, on the wafer conveyor 41 and on the stage 38, respectively. Further, dry air is distributed to the wafer waiting location 40, the wafer conveyor 41 and the stage 38 through respective air pipes provided with respective control valves 57a, 57b and 57c. The control device 56 monitors the outputs of the detector 55a–55c in order to determine any area(s) in which no wafer exists, and controls the flow rate of dry air to be supplied to such area(s) by throttling or closing the corresponding control valve(s) (see flow chart of FIG. 11). This control of dry air depending on presence/absence of wafer contributes to the reduction of the running cost in the case where the dry air is supplied from a steel cylinder or a storage tank.

Figure 12:
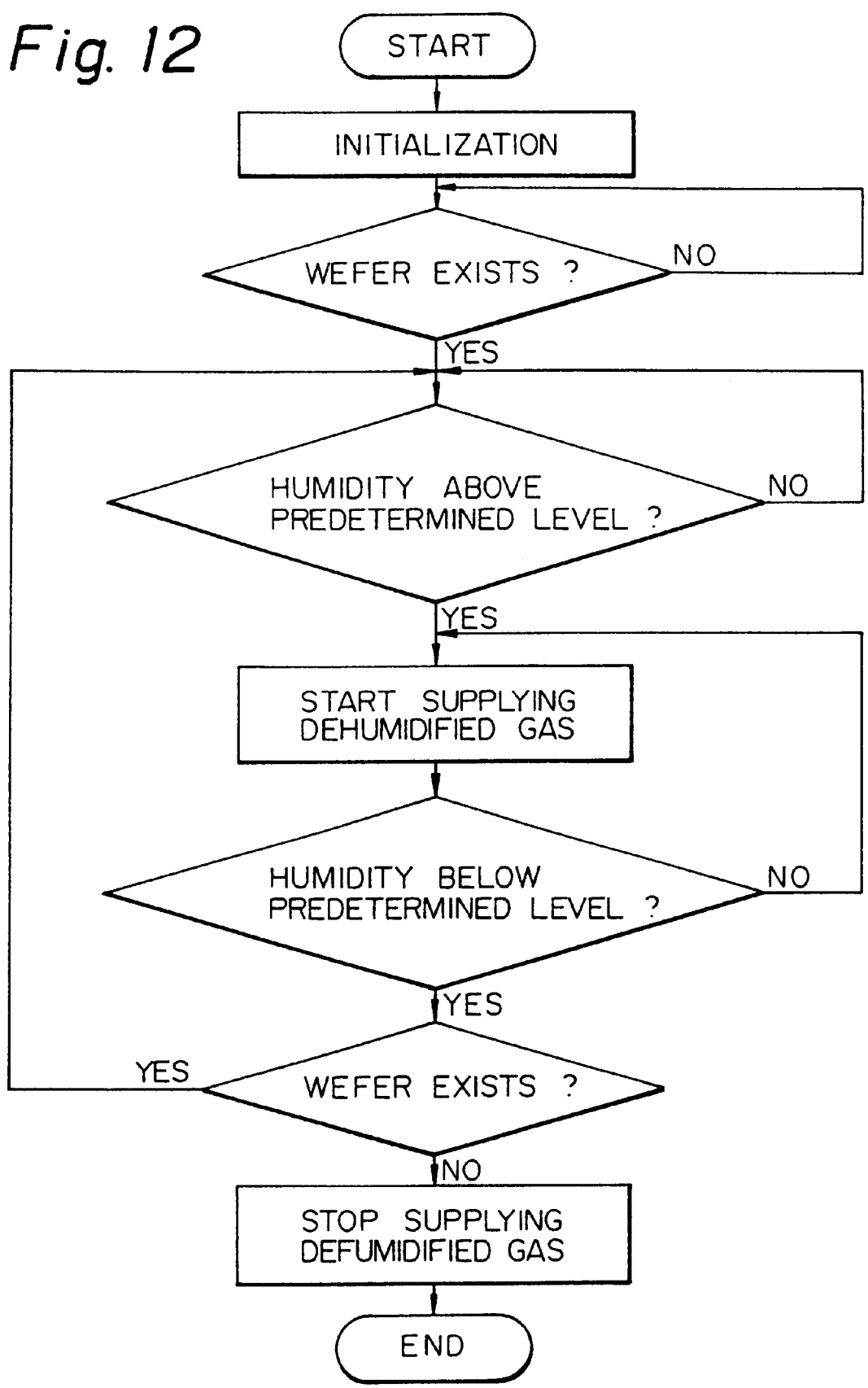
FIG. 12 is a flow chart illustrating another sequence of operations of the exposure apparatus shown in FIG. 10.

As with the embodiment of FIG. 8, the embodiment of FIG. 10 may include hygrometers disposed in the wafer process atmosphere in order to provide the humidity control of that atmosphere (see flow chart of FIG. 12).

An impurity-removing filter may be preferably disposed at the air inlet of the dehumidifier 42. As shown in FIG. 13, the impurity-removing filter may preferably comprise a combination of a chemical filter 60 and a particulate filter 61 such as a HEPA filter, an ULPA filter or the like. Gaseous impurities to be removed by the chemical filter 60 include $SO_4^{2-}$, $NH_4^+$, organosilicon compounds, trimethylsilanol, N-methyl-2-pyrrolidon and others.

FIG. 14 is a schematic representation showing a further exemplified exposure apparatus according to the fourth embodiment of the present invention.

In the arrangement shown in FIG. 14, the atmosphere surrounding an illumination optical system is confined in a housing 62 and dehumidified air is supplied to the confined atmosphere through a supply pipe 63. It is not necessarily required to house the entire illumination optical system in the housing 62. Only such a part of the illumination optical system may be housed in the housing 62 that is highly subject to contamination and/or is likely to provide considerable degradation in optical performance when contaminated.

As is clearly understood from the above, dehumidified air containing little water, which otherwise could be a carrier of contaminants or could be itself comprise a contaminant, is supplied to such areas of the apparatus that otherwise could be subject to considerable contamination. In this manner, any contamination inside the apparatus may be lowered and the longer maintenance intervals may be allowed. Further, according to the invention, the supplied dehumidified air is produced by removing water from the ambient air resulting in lower cost, and the control of the flow rate of the supplied dehumidified air supplied can prevent waist of the supplied dehumidified air, resulting in a lower cost for maintenance of the apparatus.

Referring next to FIGS. 15 to 24, an air-conditioning apparatus according to a still further embodiment of the present invention will be described, which is useful to achieve the fourth object of the present invention described above.

Figure 15:
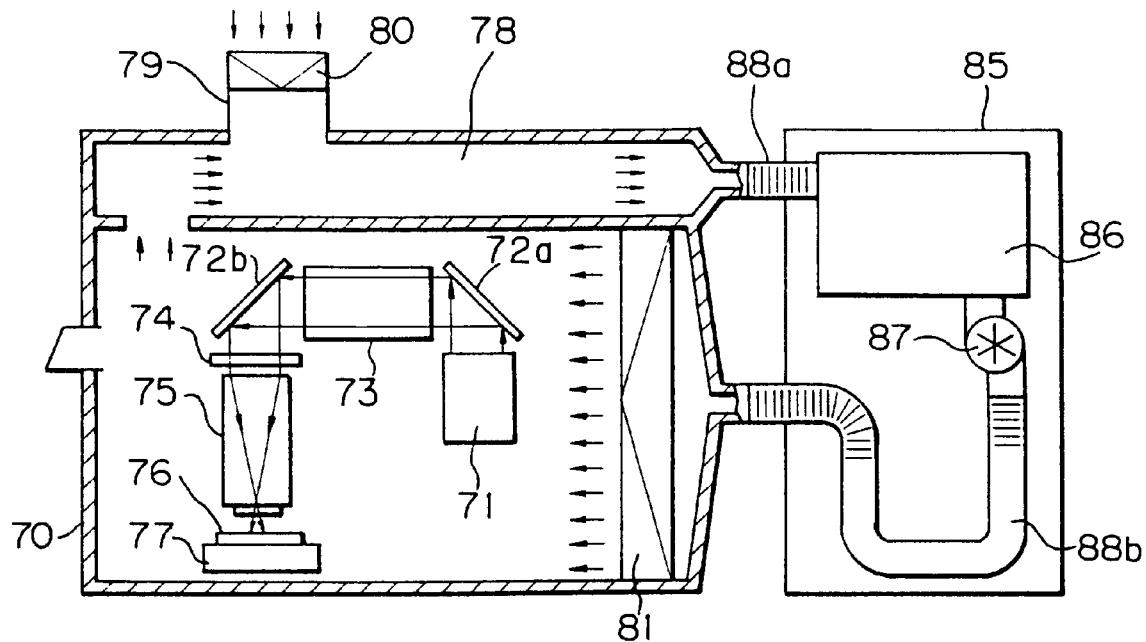
FIG. 15 is a schematic representation of an exemplified air-conditioning apparatus showing a fifth embodiment of the present invention.

FIG. 15 is a schematic representation showing a exemplified application of the present invention to an air-conditioning apparatus for an exposure apparatus. The exposure apparatus has an exposure unit housed in a chamber 70 to which the air-conditioning apparatus 85 is connected. A DUV light source 71 is provided, which may be an excimer laser or a mercury lamp. The light source 71 emits a light beam which is reflected by a first mirror 72a into an illumination optical system 73. The illumination optical system 73 comprises an illuminance equalizer, which may be an optical integrator (a fly-eye lens, for example) or a condenser lens. The illumination optical system 73 further comprises various lenses and mirrors. The light beam is shaped by the illumination optical system 73 into an illumination light beam having uniform illuminance distribution over its entire cross section. The illumination light beam having the uniform illuminance distribution exits the illumination optical system 73 and again reflected by a second mirror 72b into a reticle 74. The reticle 74 has a pattern formed thereon and is illuminated uniformly by the illumination light beam. The pattern on the reticle 74 is projected through a projection lens 75 onto a photosensitized substrate 76 and an image of the pattern is formed on and transferred to the substrate 76. The substrate 76 may be, typically, a wafer having a layer of resist formed thereon, and thus we call it "wafer" hereinafter. The wafer 76 is carried on a two-dimensionally movable XY-stage 77.

The air inside the chamber 70 is temperature-controlled by the air-conditioning apparatus 85 which comprises a heater/cooler 86 and an gas-delivering fan 87 and connected with the chamber 70 through air ducts 88a and 88b. An air stream passes through the space around the exposure unit into a return passage 78 and then undergoes temperature-control by the air-conditioning apparatus 85 and enter again into the chamber 70 for recirculation.

The pressure in the return passage 78, which is upstream of the air-conditioning apparatus 85, is a negative pressure with respect to the air pressure outside the chamber 70. This negative pressure serves to draw the ambient air into the chamber 70 through an air inlet 79, so that air is supplied from the outside of the chamber 70 at the same rate as the leakage air out of the chamber 70 escapes from the space around the exposure unit. The air inlet 79 is provided with an impurity-removing filter unit 80, through which the ambient air is introduced into the chamber 70.

In this exemplified arrangement, a chemical filter element, which serves to remove gaseous impurities from the air recirculating in the chamber 70, is disposed in a duct 88b of the air-conditioning apparatus 85. As the result, only a particulate filter 81 has to be disposed in the chamber 70 and the chemical filter occupies none of the space inside the chamber, which may be effectively used for other purposes.

Next, we will describe various manners of disposing of a chemical filter element in a duct with reference to FIGS. 16 to 24.

Figure 16:
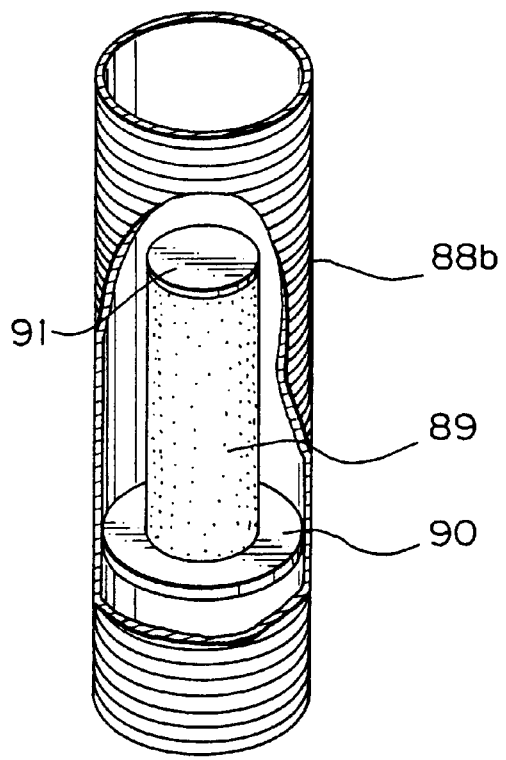
FIG. 16 is a perspective view, partially broken away, of a duct showing an exemplified filter element disposed in the duct.
Figure 17:
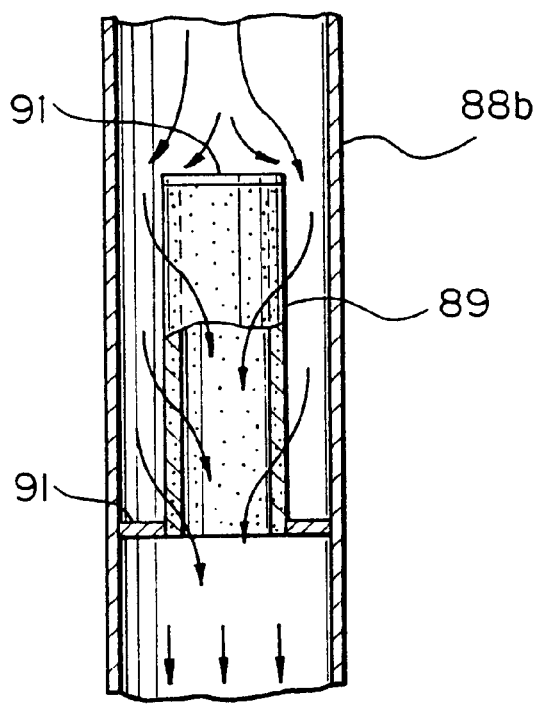
FIG. 17 is a longitudinal sectional view of the duct showing the filter element shown in FIG. 16.

FIG. 16 is a perspective view of the duct, partially broken away, showing the chemical filter element disposed in the duct, and FIG. 17 is a longitudinal cross section of the duct. As shown, the duct 88b for supplying gas to the chamber 70 houses a chemical filter element 89, which comprises a hollow cylindrical body with its upper end closed by a top plate 91. The duct 88b has an inner flange 90 serving as a partition wall, to which the lower end of the chemical filter element 89 is fixedly connected. The partition wall (inner flange) 90 extends between the lower edge of the chemical filter element 89 and the inner wall of the duct 88b in order to ensure that all the gas flowing through the duct 88b necessarily passes through the chemical filter 89. Alternatively, the partition wall 90 itself may be made of the same chemical filter material as the chemical filter element 89. The gas flowing in the duct 88b passes through the cylindrical wall of the chemical filter 89 from the outside to the inside, during which any gaseous impurities are removed from the gas. The part of the duct 88b which supports and houses the chemical filter element 89 therein is separated and detachable from the remaining part of the duct 88b, and when the chemical filter element 89 needs to be replaced with a new one, that part of the duct and the chemical filter element therein are together replaced.

The top plate 91 of the chemical filter element 89 extends perpendicular to the direction of the arriving gas stream impinging against the top plate 91. Therefore if the top plate 91 were made of the same chemical filter material as the cylindrical wall of the chemical filter element 89, it would suffer from earlier degradation than the cylindrical wall because the gas passing through such top plate would have a much larger flow rate per unit of area than the gas passing through the cylindrical wall, which is apparently inconvenient. In view of this, the top plate 91 may be preferably made of one of materials allowing little outgassing, such as a piece of stainless steel sheet processed by electropolishing or of any fluororesin.

Figure 18:
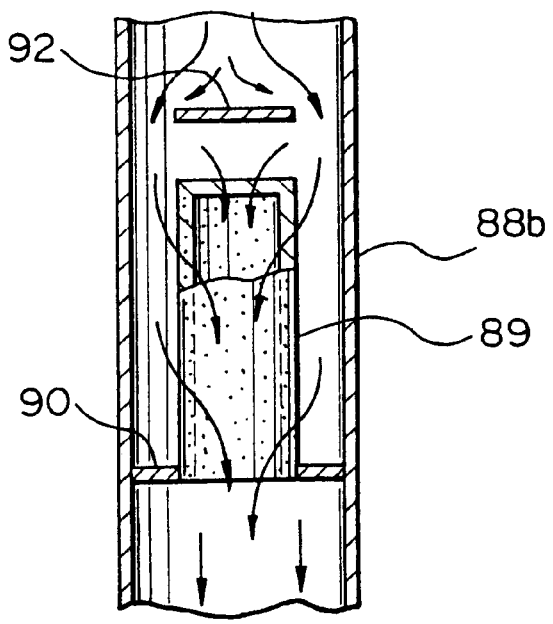
FIG. 18 is a longitudinal sectional view of a duct showing another exemplified filter element and an associated baffle plate in the duct.

Nevertheless, in the case where the top plate 91 is made of the same chemical filter material as the cylindrical body of the chemical filter element 89, it may be preferable that a baffle plate 92 is disposed upstream of the top plate as shown in FIG. 18. The baffle plate 92 may be made of a stainless steel sheet processed by electropolishing or of any suitable fluororesin. The baffle plate 92 causes the gas stream to diverge so as to reduce the flow rate per unit of area of the gas passing through the top plate 91, so that the earlier degradation of the chemical filter material forming the top plate may be effectively prevented.

Figure 19:
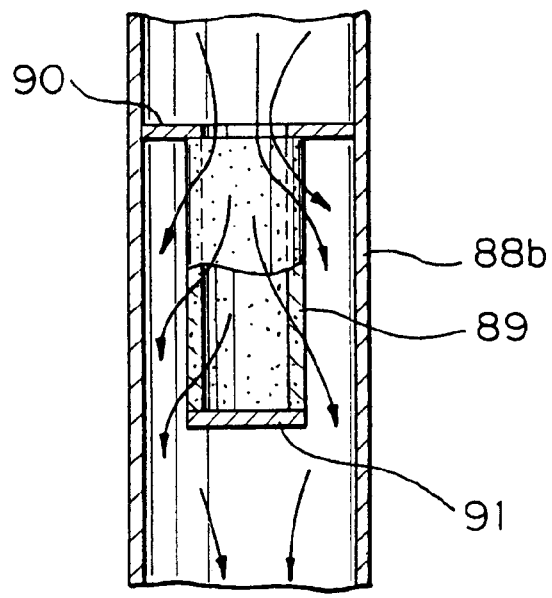
FIG. 19 is a longitudinal sectional view of a duct showing a further exemplified filter element in the duct.

As shown in FIG. 19, the hollow cylindrical chemical filter element 89 may be disposed in the duct 88b upside down with respect to the disposition of FIGS. 16 to 18. In such case, the gas flowing in the duct 88b passes through the cylindrical wall of the chemical filter element 89 from the inside to the outside. If the top plate 91 is made of the same chemical filter material as the cylindrical wall of the chemical filter element, the flow rate per unit of the gas passing through the top plate 91 is much greater than that of the gas passing through the cylindrical wall, resulting in the earlier degradation of the top plate 91. Thus, it may be preferable that the top plate 91 is made of a gas-nonpermeable material.

If a part of a filter element for removing gaseous impurities happens to come into contact with the inner wall of the duct in which it is disposed, that part of the filter element would lose its gas-permeability fully or partially. Even a partial loss of the gas-permeability of a filter element may cause an increase in the pressure loss across the filter element and a decrease in the effective area of the filter element, resulting in a shorter operational life of the filter element. Further, any increase in the pressure loss causes the corresponding increase in the load imposed on the gas-delivering fan, which may result in an insufficient supply of gas. It is necessary therefore to keep the filter element out of contact with the inner wall of the duct.

Figure 20:
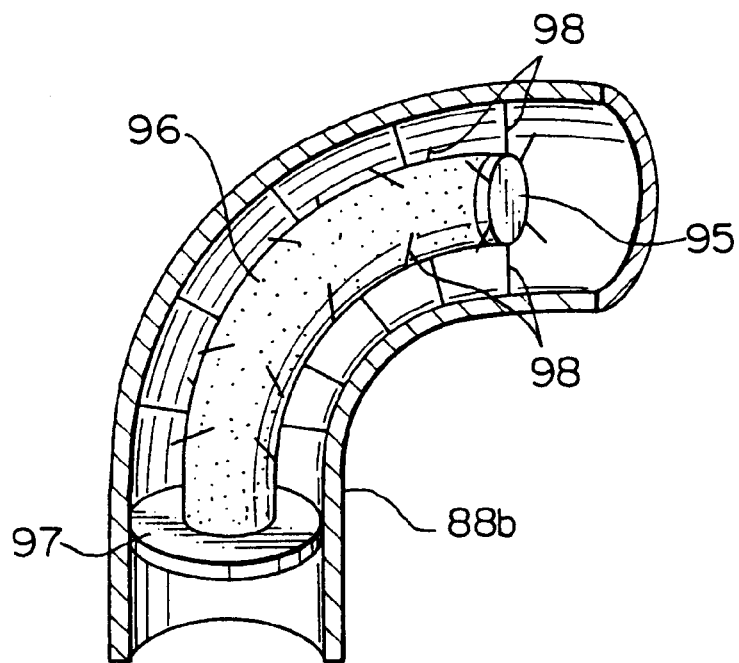
FIG. 20 is a longitudinal sectional view of a duct showing a yet further exemplified filter element in the duct.
Figure 21:
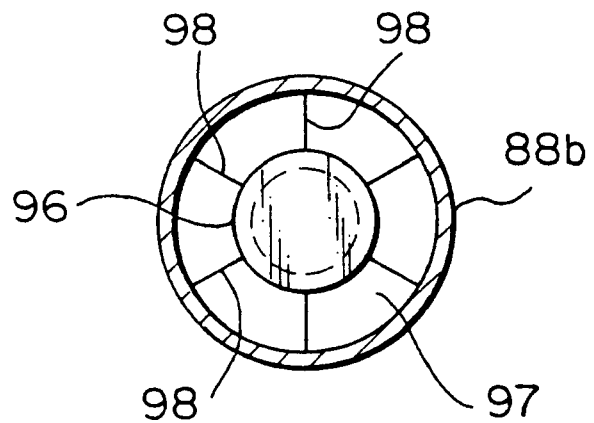
FIG. 21 is a cross sectional view of the duct and the filter element shown in FIG. 20.

FIGS. 20 and 21 show an exemplified arrangement for keeping a chemical filter element out of contact with a duct. FIG. 20 is a longitudinal section of the duct and FIG. 21 is its cross section. In this arrangement, a cylindrical chemical filter element 96 has a top plate 95 made of a suitable gas-permeable material and fixed to an annular partition wall formed as an inner flange of a duct 88b. The filter element 96 is connected, at a plurality of positions along the length of the element, with the inner wall of the duct 88b through corresponding sets of support members (wire spokes, for example) 98. The support members 98 define the space between the outer surface of the filter element 96 and the inner wall of the duct 88b. Thus, when the duct 88b is bent, the chemical filter element 96 in the duct 88b is also bent with the space between the outer surface of the filter element 96 and the inner wall of the duct 88b being kept substantially unchanged, so that the filter element 96 is kept out of contact with the inner wall of the duct 88b even when the latter is bent.

Figure 22:
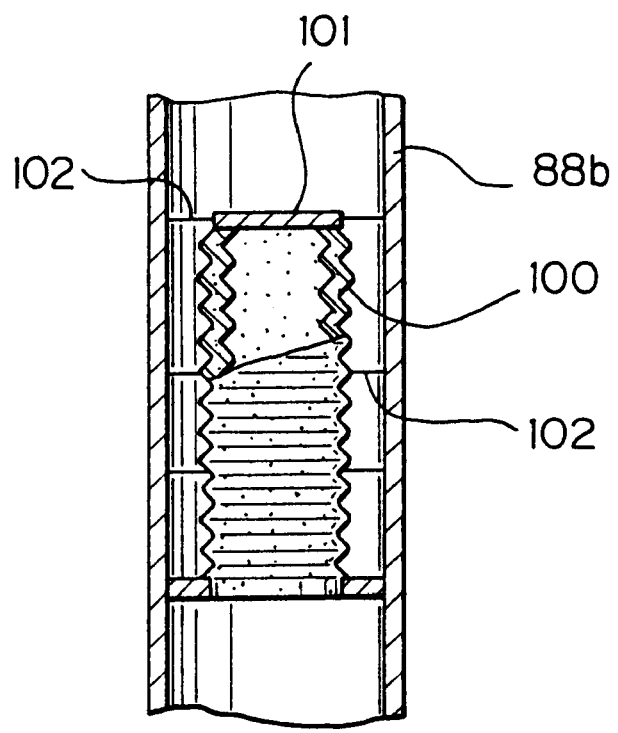
FIG. 22 is a longitudinal sectional view of a duct showing a still further exemplified filter element in the duct.

FIG. 22 shows another exemplified arrangement using a different chemical filter element. In this arrangement, the chemical filter element 100 comprises a bellows wall and a top plate 101 made of a suitable gas-permeable material. The bellows wall is longitudinally extendable and contractible. The filter element 100 is connected, at a plurality of positions along the length of the element, with the inner wall of the duct 88b through corresponding sets of support members (wire spokes, for example) 102. The bellows wall provides a larger surface area and a greater bendability of the element than a simple cylindrical wall for the same size of filter element. This results in a high bendability of the duct 88b housing the filter element 100, which in turn allow less restricted layout of the duct 88b utilizing a free space in the apparatus which is generally very tight. The larger surface area of the filter element may provide the smaller pressure loss and the longer operational life.

Figure 23:
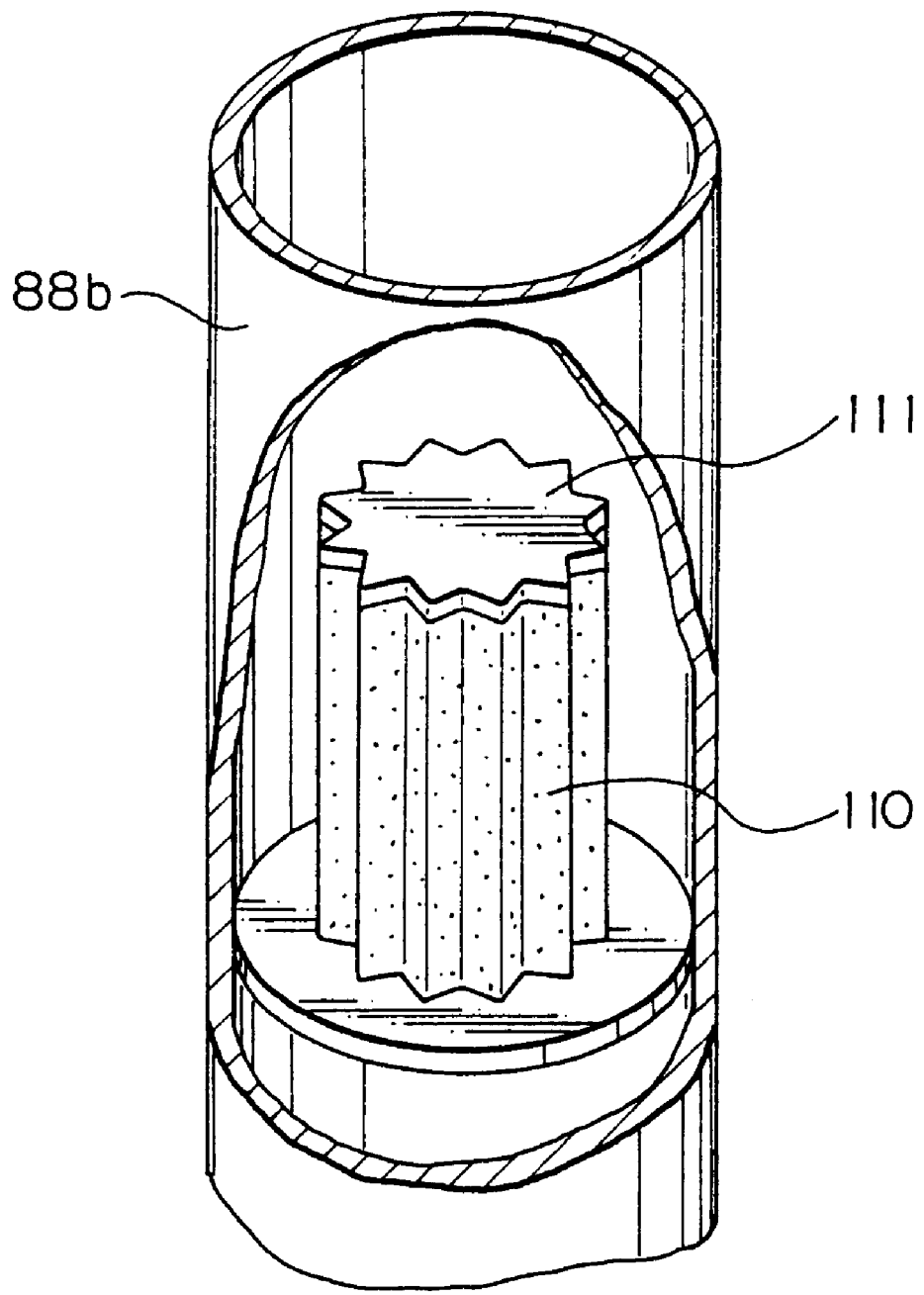
FIG. 23 is a perspective view, partially broken away, of a duct showing a still further exemplified filter element in the duct.

FIG. 23 shows a further exemplified chemical filter element. The chemical filter element 110 has a serrated side wall and a top wall 111. The serrated side wall provides a larger operational area for a given size of element, which in turn provides the higher filter efficiency, the smaller pressure loss and the longer operational life of the element. The top plate 111 may be made of a piece of electoropolished stainless steel sheet or a fluororesin plate.

Figure 24:
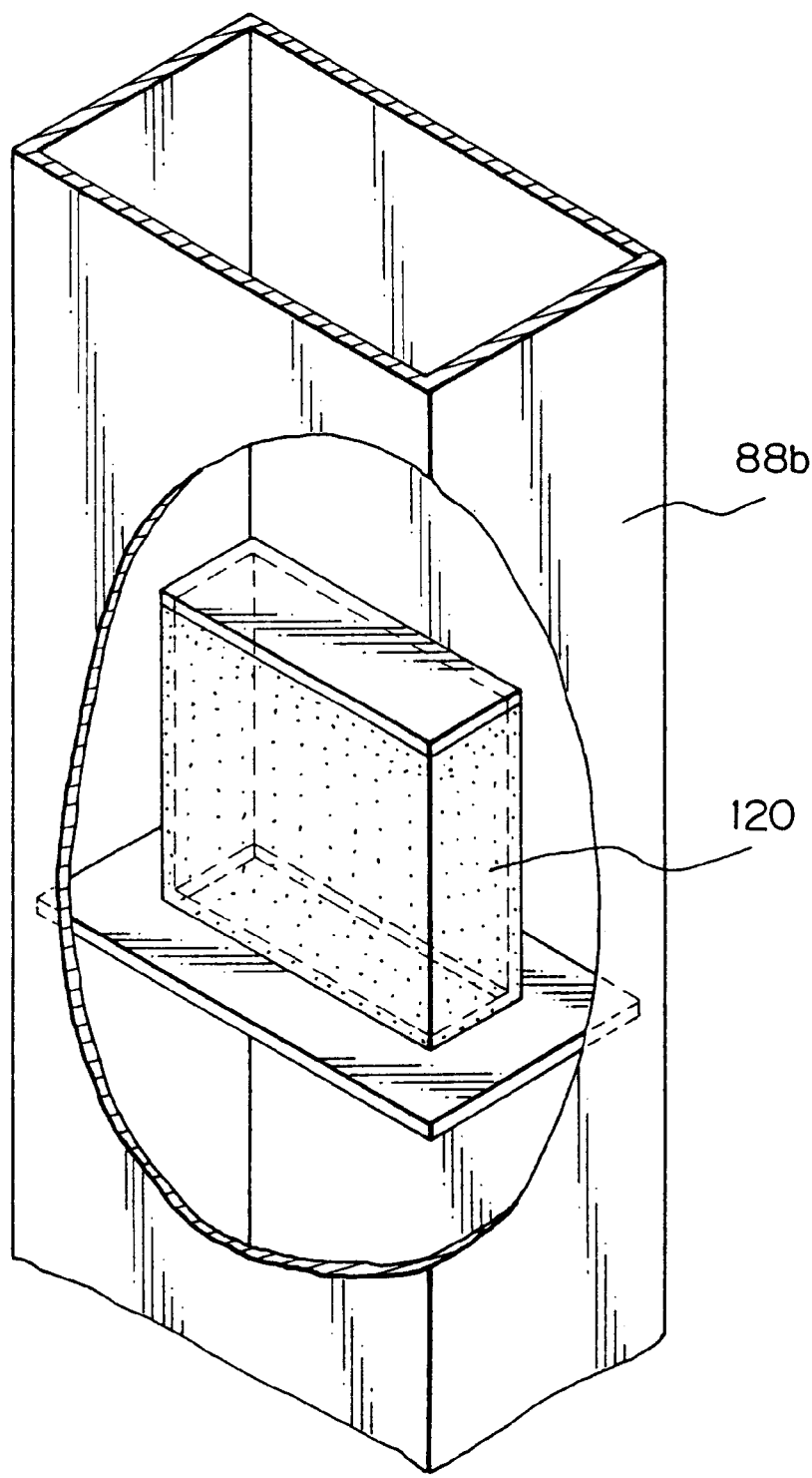
FIG. 24 is a perspective view, partially broken away, of a duct showing a still further exemplified filter element in the duct.

Not only chemical filter elements having a generally cylindrical shape but also chemical filter elements of various shapes may be used. For example, a chemical filter element having a box-like shape as shown in FIG. 24, as well as polygon shaped filter element may be used.

The duct may house not only a chemical filter element but also a particulate filter element together with a chemical filter element. In such case, the particulate filter element occupies no space in the chamber for the exposure apparatus, so that the space may be effectively used for other purposes. Air-conditioning apparatus according to the present invention may be used not for the exposure apparatus but also for the building having a clean room.

As is clearly understood from the foregoing, the disclosed air-conditioning apparatus allows the impurity-removing filter element to be installed in the duct, such that it occupies no space outside the duct. Thus, the space in the exposure apparatus as well as the space in the clean room in which the exposure apparatus is equipped may be effectively used for other purposes.

The present invention is not limited to the embodiments described above, but may be embodied in various other forms and arrangements without departing from the spirit and the scope of the present invention.

What is claimed is:

1. An exposure apparatus for transferring a pattern formed on a mask onto a photosensitized substrate by exposure, comprising:
   a light source to emit a light beam having a wavelength falling in a range from ultraviolet to deep ultraviolet radiation;
   an illumination optical system to direct said light beam from said light source into said mask;
   an exposure unit to make exposure of a photosensitized substrate in order to transfer said pattern formed on said mask onto said photosensitized substrate;
   a chamber to house at least one of said illumination optical system and said exposure unit;
   an ambient air introducing unit to introduce ambient air into said chamber;
   an impurity-removing filter to remove gaseous impurities from at least one of ambient air being introduced into said chamber and a gas recirculating in said chamber;
   a pair of impurity-concentration-measuring devices disposed upstream and downstream, respectively, of said impurity-removing filter;
   a filter end-of-life determination device to determine end-of-life of said impurity-removing filter based on measurements from said impurity-concentration-measuring device disposed upstream of said impurity-removing filter and measurements from said impurity-concentration-measuring device disposed downstream of said impurity-removing filter; and
   a control device to control stopping operation of said ambient air introducing unit when said impurity-concentration-measuring device disposed upstream of said impurity-removing filter has indicated a gaseous impurity concentration above a predetermined level.

2. An exposure apparatus according to claim 1, wherein:
   said impurity-removing filter is arranged for removing gaseous impurities from said ambient air being introduced into said chamber.

3. An exposure apparatus according to claim 1, wherein:
   each of said impurity-concentration-measuring devices measures concentration of at least one of ammonium ion ($NH_4^+$) and sulfate ion ($SO_4^{2-}$).

4. An exposure apparatus according to claim 1, wherein:
   each of said impurity-concentration-measuring devices measures concentration of organic compounds.

5. An exposure apparatus for transferring a pattern formed on a mask onto a photosensitized substrate, comprising:
   a chamber;
   an exposure unit disposed in said chamber to transfer said pattern formed on said mask onto said photosensitized substrate;
   an ambient air introducing unit disposed to said chamber to introduce ambient air into said chamber;
   an impurity-removing filter coupled to said ambient air introducing unit to remove gaseous impurities from ambient air being introduced into said chamber;
   an impurity-concentration-measuring device disposed upstream of said ambient air introducing unit to measure an impurity concentration of gaseous impurities in ambient air being introduced into said chamber; and
   a control device coupled to said ambient air introducing unit to control operation of said ambient air introducing unit when said impurity-concentration-measuring device has indicated a gaseous impurity concentration above a predetermined level.

6. An exposure apparatus according to claim 5, wherein:
   said impurity-concentration-measuring device measures concentration of at least one of ammonium ion ($NH_4^+$) and sulfate ion ($SO_4^{2-}$).

7. An exposure apparatus according to claim 5, wherein:
   said impurity-concentration-measuring device measures concentration of organic compounds.

8. An exposure apparatus for transferring a pattern formed on a mask onto a photosensitized substrate; comprising:
   a chamber having an air inlet;
   an exposure unit disposed in said chamber to transfer said pattern formed on said mask onto said photosensitized substrate;
   an ambient air introducing unit disposed to the air inlet to introduce ambient air into said chamber;
   an impurity-removing filter disposed to the air inlet to remove gaseous impurities from ambient air being introduced into said chamber;
   an impurity-concentration-measuring device disposed upstream of said impurity-removing filter;
   a filter end-of-life determination device connected to said impurity-concentration-measuring device to determine end-of-life of said impurity-removing filter based on measurements from said impurity-concentration-measuring device; and
   a control device connected to said impurity-concentration-measuring device to control said exposure apparatus when said impurity-concentration-measuring device has indicated a gaseous impurity concentration above a predetermined level.

9. An exposure apparatus according to claim 8, wherein:
   said impurity-removing filter is arranged for removing gaseous impurities from said ambient air being introduced into said chamber, and wherein said exposure apparatus further comprises a control device connected to said ambient air introducing unit to stop operation of said ambient air introducing unit when said impurity-concentration-measuring device disposed upstream of said impurity-removing filter has indicated a gaseous impurity concentration above a predetermined level.

10. An exposure apparatus according to claim 8, wherein:
    each of said impurity-concentration-measuring devices measures concentration of at least one of ammonium in ($NH_4^+$) and sulfate ion ($SO_4^{2-}$).

11. An exposure apparatus according to claim 8, wherein:
    each of said impurity-concentration-measuring devices measures concentration of organic compounds.

12. An exposure apparatus, comprising:
    a chamber;
    an exposure unit disposed in said chamber to form a pattern image on a substrate;
    an introducing unit connected to said chamber to introduce an ambient air into said chamber;
    an impurity-concentration-measuring device disposed in an ambience in which said chamber is disposed to measure an impurity-concentration of gaseous impurity in the ambience air being introduced into said chamber; and a control device connected to said introducing unit to control said introducing unit on the basis of measurement results from said impurity concentration-measuring device.

13. An exposure apparatus according to claim 12, wherein:

said control device stops an operation of said introducing unit when said impurity-concentration-measuring device has indicated the impurity concentration above a predetermined level.

14. An exposure apparatus; comprising:

a chamber;

an exposure unit disposed in said chamber to form a pattern image on a photosensitive substrate mounted on a stage;

an impurity-removing filter disposed in said chamber to remove an impurity in said chamber;

an impurity-concentration-measuring device disposed in the vicinity of the stage to measure an impurity-concentration in vicinity of the stage;

a filter end-of-life determination device connected to said impurity-concentration-measuring device to determine end-of-life of said impurity-removing filter based on measurements from said impurity-concentration-measuring device; and a control device connected to said impurity-concentration-measuring device to control said exposure apparatus when said impurity-concentration-measuring device has indicated a gaseous impurity concentration above a predetermined level.

15. An exposure apparatus according to claim 14, wherein:

said impurity-removing filter is disposed in a gas circulating in said chamber.

16. An exposure apparatus according to claim 5, wherein:

said impurity-concentration-measuring device measures concentration of impurities in an ambient in which said chamber is disposed.

17. An exposure apparatus according to claim 5, wherein:

said control device stops an operation of said ambient air ointroducing unit when said impurity-concentration-measuring device has indicated a gaseous impurity concentration above a predetermined level.

18. An exposure apparatus according to claim 5, wherein:

said control device provides an alarm indicating abnormality in an ambient in which said chamber is disposed when said impurity-concentration-measuring device has indicated a gaseous impurity concentration above a predetermined level.

19. An exposure apparatus according to claim 5, wherein:

said exposure apparatus further comprises an impurity-concentration-measuring devic disposed downstream of said ambient air introducing unit; and a filter end of life determination device connected to the impurity-concentration-measuring device to determine end of life of said impurity-removing filter based on measurments from said impurity-concentration-measuring device disposed upstream of said impurity-removing filter and measurements from said impurity-concentration-measuring device disposed downstream of said impurity-removing filter.

20. An exposure apparatus according to claim 19, wherein:

said exposure apparatus further comprises a chemical filter which is disposed in said chamber and removes gaseous impurities from a gas recirculating insaid chamber.

21. An exposure apparatus according to claim 12, wherein:

said impurity-concentration-measuring device is disposed upstream of said ambient air introducing unit.

22. An exposure apparatus according to claim 21, wherein:

said control device stops operation of said ambient air introducing unit on the basis of measurements from said impurity-concentration-measuring device.

23. An exposure apparatus according to claim 22, wherein:

said control device provides an alarm indicating abnormality in the ambient on the basis of measurements from said impurity-concentration-measuring device.

24. An exposure apparatus according to claim 23, wherein:

said ambient air introducing unit further comprises an impurity-removing filter for removing gaseous impurities from a gas in the ambient.

25. An exposure apparatus according to claim 24, wherein:

said exposure apparatus further comprises a chemical filter which is disposed in said chamber and removes gaseous impurities from a gas re-circulating in said chamber.

26. An exposure apapratus according to claim 12, wherein:

said exposure apparatus further comprises an illumination optical system which is disposed in said chamber and illuminates the mask.

27. An exposure apparatus according to claim 12, wherein:

said introducing unit is disposed in an air inlet of said chamber.

* * * * *